(12) United States Patent
Choi et al.

(10) Patent No.: US 9,006,902 B2
(45) Date of Patent: Apr. 14, 2015

(54) SEMICONDUCTOR DEVICES HAVING THROUGH SILICON VIAS AND METHODS OF FABRICATING THE SAME

(71) Applicant: Samsung Electronics Co., Ltd., Suwon-si (KR)

(72) Inventors: Ju-Il Choi, Suwon-si (KR); Su-Kyoung Kim, Suwon-si (KR); Kun-Sang Park, Hwaseong-si (KR); Seong-Min Son, Hwaseong-si (KR); Jin-Ho An, Seoul (KR); Do-Sun Lee, Gwangju (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/161,034

(22) Filed: Jan. 22, 2014

(65) Prior Publication Data
US 2014/0217559 A1    Aug. 7, 2014

(30) Foreign Application Priority Data

Feb. 6, 2013    (KR) ......................... 10-2013-0013451

(51) Int. Cl.
| | | |
|---|---|---|
| H01L 23/48 | (2006.01) | |
| H01L 21/4763 | (2006.01) | |
| H01L 23/522 | (2006.01) | |
| H01L 23/532 | (2006.01) | |

(52) U.S. Cl.
CPC .......... *H01L 23/5226* (2013.01); *H01L 23/481* (2013.01); *H01L 23/53295* (2013.01); *H01L 2224/13* (2013.01); *H01L 2224/16145* (2013.01); *H01L 2224/16225* (2013.01); *H01L 2924/15311* (2013.01)

(58) Field of Classification Search
CPC ............ H01L 23/481; H01L 23/49827; H01L 21/76898; H01L 21/486; H01L 23/5384
USPC ................. 438/618, 627, 637, 638, 643, 652; 257/750, 751, 773–775
See application file for complete search history.

(56) References Cited

U.S. PATENT DOCUMENTS

| | | | |
|---|---|---|---|
| 6,020,266 A | | 2/2000 | Hussein et al. |
| 7,094,701 B2 | | 8/2006 | Umemoto et al. |
| 7,282,444 B2 | | 10/2007 | Tanida et al. |
| 7,365,440 B2 | | 4/2008 | Dotta |
| 7,416,963 B2 | | 8/2008 | Umemoto et al. |
| 7,646,100 B2 | | 1/2010 | Kameyama et al. |
| 7,777,345 B2 | | 8/2010 | Lee et al. |
| 8,159,071 B2 | | 4/2012 | Kim et al. |
| 8,531,035 B2 | * | 9/2013 | Yu et al. ......................... 257/774 |
| 8,822,329 B2 | * | 9/2014 | Leuschner et al. ............ 438/627 |

(Continued)

FOREIGN PATENT DOCUMENTS

| | | |
|---|---|---|
| JP | 2009-016406 | 1/2009 |
| KR | 10-2010-0095268 A | 8/2010 |

*Primary Examiner* — Hsien Ming Lee
(74) *Attorney, Agent, or Firm* — Myers Bigel Sibley & Sajovec

(57) ABSTRACT

A semiconductor device is provided having an insulating layer on a semiconductor substrate. The insulating layer and the semiconductor substrate define a through hole penetrating the semiconductor substrate and the insulating layer. A through electrode is provided in the through hole. A spacer is provided between the semiconductor substrate and the through electrode. An interconnection in continuity with the through electrode is provided on the insulating layer. A barrier layer covering a side and a bottom of the interconnection and a side of the through electrode is provided and the barrier layer is formed in one body.

18 Claims, 28 Drawing Sheets

(56) References Cited

U.S. PATENT DOCUMENTS

2009/0057844 A1  3/2009  Tanida et al.
2010/0213591 A1  8/2010  Ho et al.
2012/0056330 A1  3/2012  Lee et al.
2013/0093098 A1* 4/2013  Yang et al. .................. 257/774
2013/0285257 A1* 10/2013 Lee et al. .................... 257/774

* cited by examiner

SEMICONDUCTOR DEVICES HAVING THROUGH SILICON VIAS AND METHODS OF FABRICATING THE SAME

CROSS-REFERENCE TO RELATED APPLICATION

This application claims priority under 35 U.S.C. §119 to Korean Patent Application No. 10-2013-0013451, filed on Feb. 6, 2013, the disclosure of which is hereby incorporated herein by reference as if set forth in its entirety.

FIELD

The inventive concept relates generally to semiconductor devices and, more particularly to, semiconductor devices having through silicon vias (TSVs) and metal interconnections and related methods of fabrication.

BACKGROUND

Various attempts have been made to implement semiconductor devices using through silicon vias (TSVs) according to the need for light, thin, short, and small electronic systems.

SUMMARY

Embodiments of the inventive concept provide a semiconductor device capable of improving electric characteristics between a TSV and a metal interconnection, and maximizing mass-production efficiency.

The technical objectives of the inventive concept are not limited to the above disclosure; other objectives may become apparent to those of ordinary skill in the art based on the following descriptions.

In accordance with an aspect of the inventive concept, a semiconductor device is provided. The semiconductor device may include a first insulating layer disposed on a semiconductor substrate. A through hole penetrating the semiconductor substrate and the first insulating layer may be disposed. A through electrode may be formed in the through hole. A spacer may be formed between the semiconductor substrate and the through electrode. An interconnection in continuity with the through electrode may be formed on the first insulating layer. A barrier layer covering a side and a bottom of the interconnection, and covering a side of the through electrode may be formed. The barrier layer may be formed in one body.

The through electrode and the interconnection may include the same material layer. The through electrode and the interconnection may have a continuous grain structure. The through electrode and the interconnection may be formed with no barrier layer interposed therebetween.

A second insulating layer may be formed on the first insulating layer. An interline insulating pattern may be formed on the second insulating layer. The interline insulating pattern may include the same insulating layer simultaneously formed with the spacer. An upper surface of the interconnection may be formed to the same level as that of the interline insulating pattern.

The second insulating layer and the interline insulating pattern may cover the side of the interconnection. The barrier layer may be formed between the side of the interconnection and the interline insulating pattern, and between the side of the interconnection and the second insulating layer.

A seed layer may be formed between the interconnection and the barrier layer, and between the through electrode and the barrier layer. The through electrode and the interconnection may be formed with no seed layer interposed therebetween.

A second insulating layer may be formed on the first insulating layer. An upper surface of the interconnection may be formed to the same level as that of the second insulating layer.

In accordance with another aspect of the inventive concept, a semiconductor device is provided. The semiconductor device may include a semiconductor substrate having a first side and a second side. A first insulating layer covering the first side of the semiconductor substrate may be formed. A through hole penetrating the semiconductor substrate and the first insulating layer may be disposed. A through electrode may be formed in the through hole. A spacer may be formed between the semiconductor substrate and the through electrode. A first interconnection in continuity with the through electrode may be formed on the first insulating layer. A second interconnection spaced from the first interconnection may be formed on the first insulating layer. A first barrier layer covering sides and bottoms of the first and second interconnections, and covering a side of the through electrode may be formed. A third interconnection connected to the through electrode may be formed on the second side of the semiconductor substrate. A second barrier layer covering a side and an upper surface of the third interconnection may be formed. The through electrode and the first interconnection may be formed with no first barrier layer interposed therebetween. The second barrier layer may be interposed between the through electrode and the third interconnection.

The through electrode, the first interconnection, and the second interconnection may include the same material layer simultaneously formed.

A second insulating layer may be formed on the first insulating layer. An interline insulating pattern may be formed on the second insulating layer. The second insulating layer and the interline insulating pattern may be formed between the first interconnection and the second interconnection. The interline insulating pattern may include the same insulating layer simultaneously formed with the spacer.

A first seed layer may be formed between the first interconnection and the first barrier layer, between the second interconnection and the first barrier layer, and between the through electrode and the first barrier layer. A second seed layer may be formed between the third interconnection and the second barrier layer. The through electrode and the first interconnection may be formed with no first seed layer interposed therebetween. The second seed layer may be interposed between the through electrode and the third interconnection.

An upper surface of the spacer may protrude to a level higher than the first insulating layer. The first barrier layer may be in contact with an upper surface and sides of the spacer.

Details of some embodiments are included in the detailed description and drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

Figure 1:
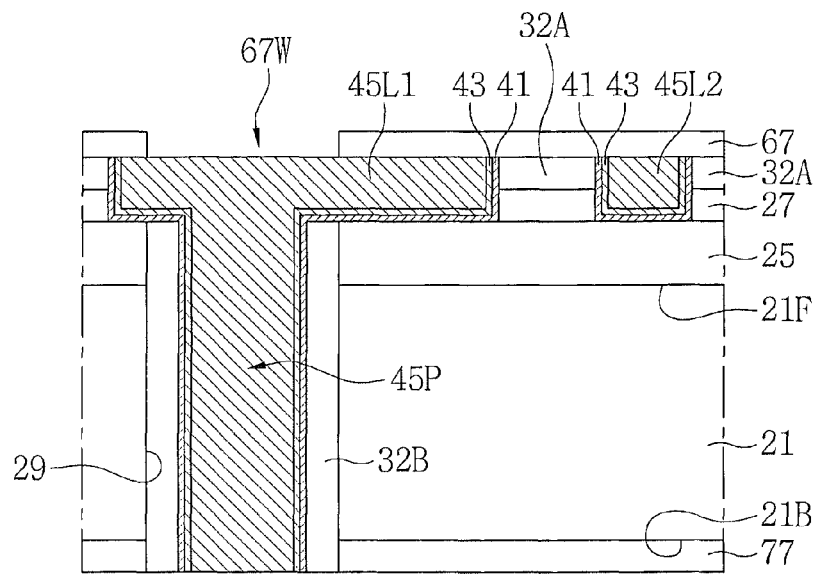
FIGS. 1 to 20 are cross-sections illustrating semiconductor devices according to some embodiments of the inventive concept.

The present inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views, in which embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

FIGS. 1 to 20 are cross-sections illustrating semiconductor devices according to some embodiments of the inventive concept. Referring first to FIG. 1, a first insulating layer 25 may be formed on a front side 21F of a substrate 21. A ninth insulating layer 77 covering a rear side 21B of the substrate 21 may be formed. A through hole 29 penetrating the substrate 21, and penetrating the first insulating layer 25 may be formed. A spacer 32B may be formed on a sidewall of the through hole 29. A through electrode 45P may be formed in the through hole 29. A first interconnection 45L1 and a second interconnection 45L2 may be formed on the first insulating layer 25. The first interconnection 45L1 may be in continuity with the through electrode 45P. The first interconnection 45L1 may be integrated with the through electrode 45P. A second insulating layer 27 and an interline insulating pattern 32A may be sequentially stacked on the first insulating layer 25. The second insulating layer 27 and the interline insulating pattern 32A may be interposed between the first interconnection 45L1 and the second interconnection 45L2. A first barrier layer 41 covering sides and bottoms of the through electrode 45P, the first interconnection 45L1, and the second interconnection 45L2 may be formed. A portion of the first barrier layer 41 covering the sides and bottoms of the through electrode 45P and the first interconnection 45L1 may be formed in one body. A first seed layer 43 interposed between the first barrier layer 41 and the through electrode 45P, between the first barrier layer 41 and the first interconnection 45L1, and between the first barrier layer 41 and the second interconnection 45L2 may be formed. An eighth insulating layer 67 covering the first interconnection 45L1 and the second interconnection 45L2 may be formed on the interline insulating pattern 32A. A connection window 67W penetrating the eighth insulating layer 67 and exposing a portion of the first interconnection 45L1 may be formed.

The first interconnection 45L1 and the second interconnection 45L2 may be spaced from each other. Upper surfaces of the interline insulating pattern 32A, the first interconnection 45L1, and the second interconnection 45L2 may be formed substantially to the same level as each other. The through electrode 45P, the first interconnection 45L1, and the second interconnection 45L2 may include the same material layer simultaneously formed. For example, the through electrode 45P, the first interconnection 45L1, and the second interconnection 45L2 may include a copper (Cu) layer formed using an electroplating method. The through electrode 45P and the first interconnection 45L1 may have a continuous grain structure. The first seed layer 43 and the first barrier layer 41 may not be interposed between the through electrode 45P and the first interconnection 45L1.

The spacer 32B and the interline insulating pattern 32A may include the same insulating layer simultaneously formed. For example, the spacer 32B and the interline insulating pattern 32A may include silicon oxide.

Figure 2:
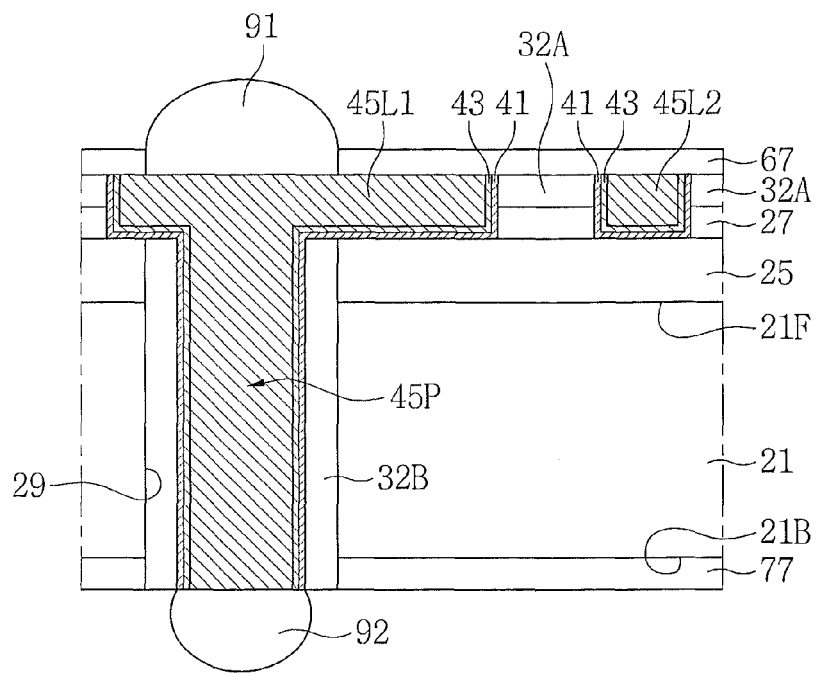

Referring to FIG. 2, a first connection terminal 91 penetrating the eighth insulating layer 67 and connected onto a first interconnection 45L1 may be formed. The first connection terminal 91 may protrude to a level higher than the eighth insulating layer 67. A second connection terminal 92 connected to a bottom of a through electrode 45P may be formed.

Figure 3:
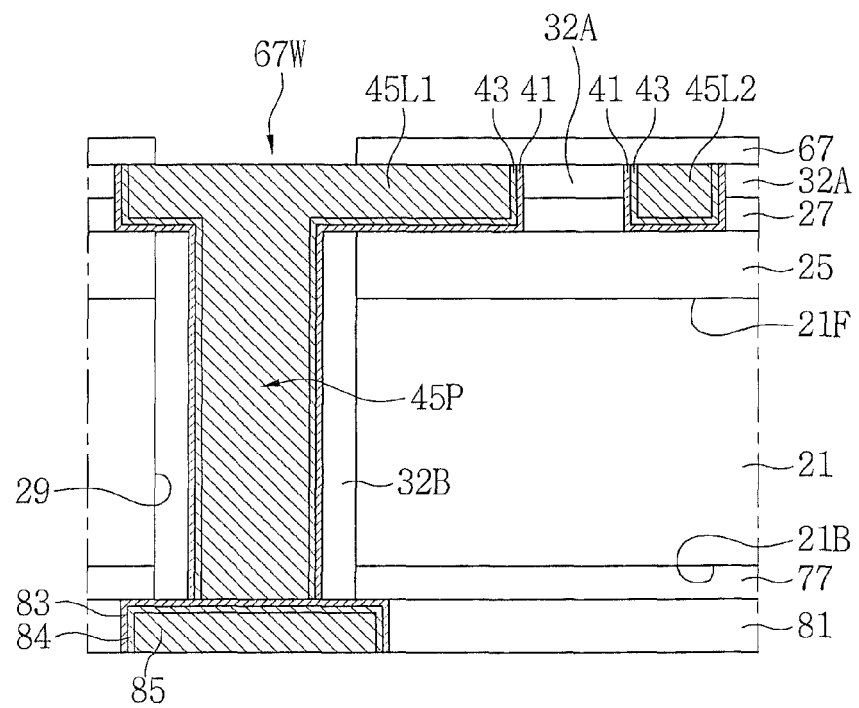

Referring to FIG. 3, a tenth insulating layer 81 may be formed on a ninth insulating layer 77. A seventh interconnection 85 penetrating the tenth insulating layer 81 and connected to a bottom of a through electrode 45P may be formed. A side and an upper surface of the seventh interconnection 85 may be covered with a fourth seed layer 84 and a fourth barrier layer 83 sequentially formed. The fourth seed layer 84 and the fourth barrier layer 83 may be interposed between the through electrode 45P and the seventh interconnection 85.

Figure 4:
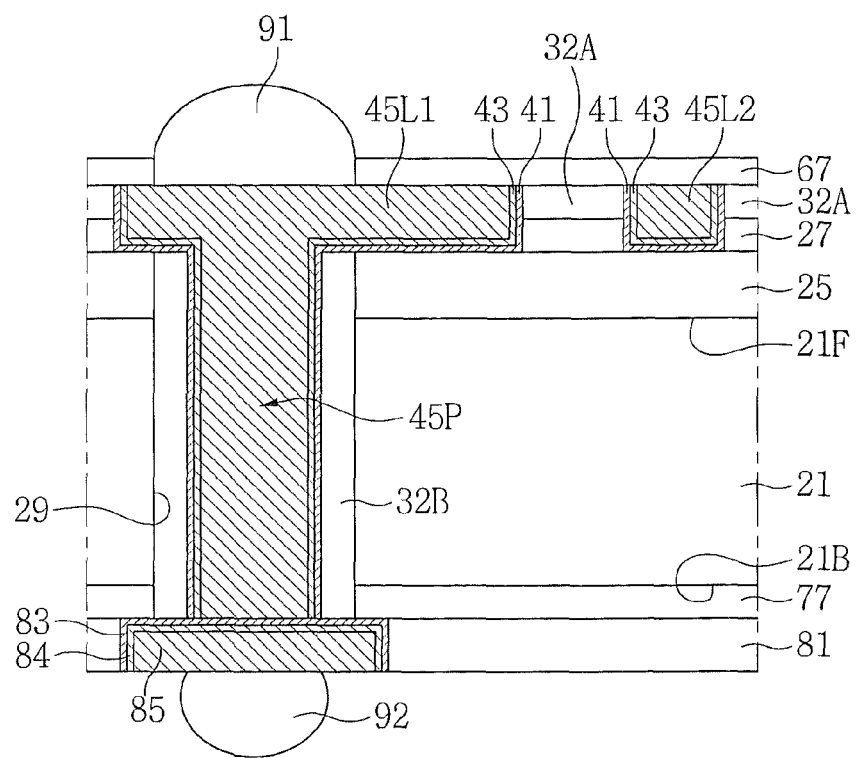
Figure 5:
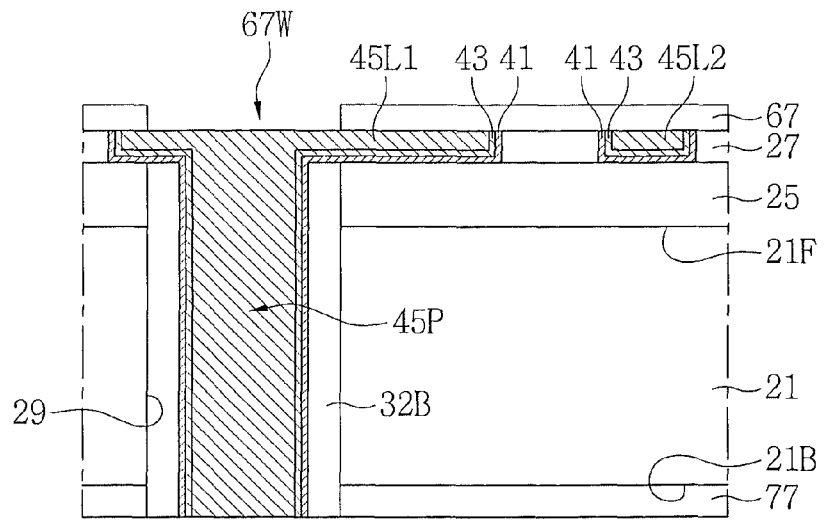

Referring to FIG. 4, a second connection terminal 92 may be formed on a seventh interconnection 85. As illustrated in FIG. 5, an eighth insulating layer 67 covering a first interconnection 45L1 and a second interconnection 45L2 may be formed on a second insulating layer 27. A connection window 67W penetrating the eighth insulating layer 67 and exposing a portion of the first interconnection 45L1 may be formed.

Figure 6:
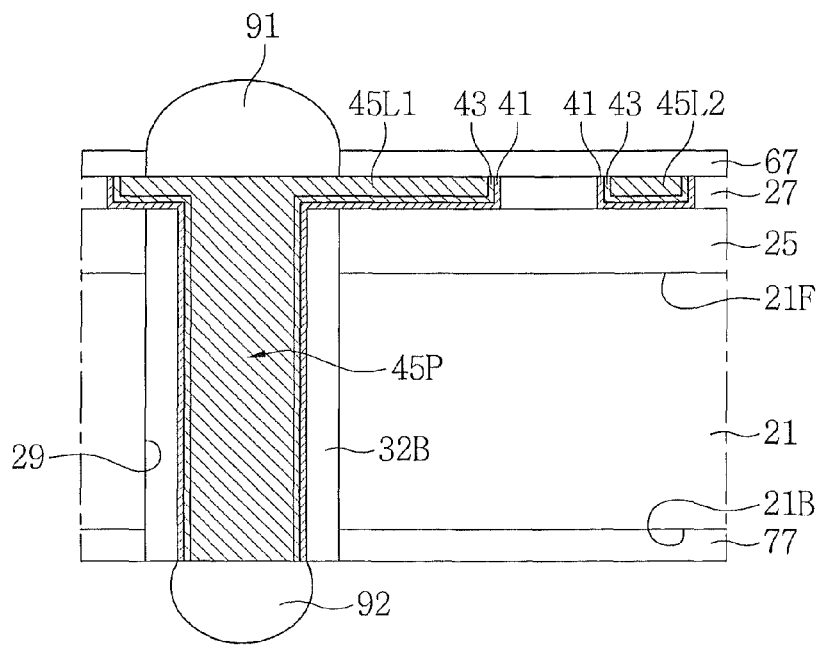

Referring to FIG. 6, an eighth insulating layer 67 may be in contact with upper surfaces of a second insulating layer 27, a first interconnection 45L1, and a second interconnection 45L2. A first connection terminal 91 penetrating the eighth insulating layer 67 and connected to the first interconnection 45L1 may be formed. A second connection terminal 92 connected to a bottom of a through electrode 45P may be formed.

Figure 7:
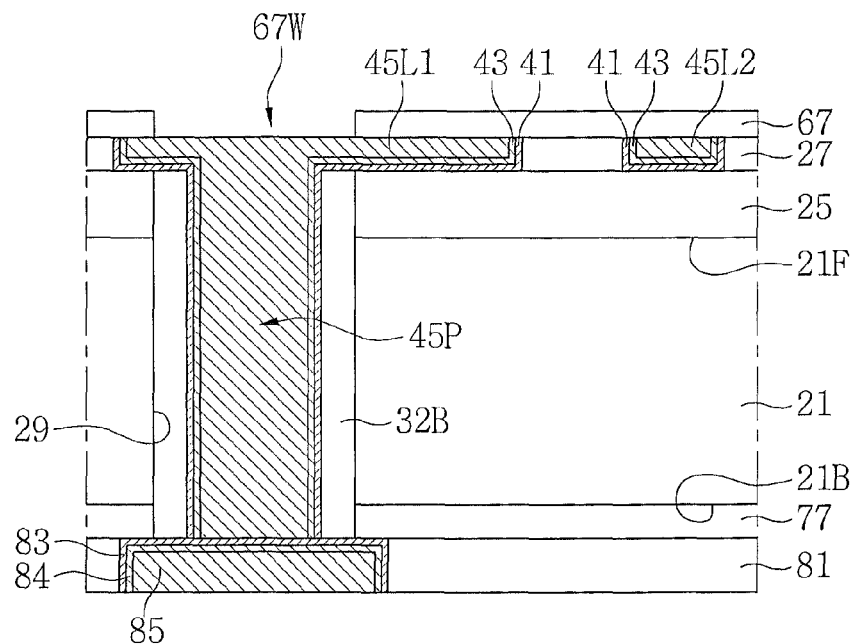

Referring to FIG. 7, an eighth insulating layer 67 may cover a second insulating layer 27, a first interconnection 45L1, and a second interconnection 45L2. A connection window 67W penetrating the eighth insulating layer 67 and exposing a portion of the first interconnection 45L1 may be formed. A tenth insulating layer 81 may be formed on a ninth insulating layer 77. A seventh interconnection 85 penetrating the tenth insulating layer 81 and connected to a bottom of a through electrode 45P may be formed. A side and an upper surface of the seventh interconnection 85 may be covered with a fourth seed layer 84 and a fourth barrier layer 83 sequentially stacked. The fourth seed layer 84 and the fourth barrier layer 83 may be interposed between the through electrode 45P and the seventh interconnection 85.

Figure 8:
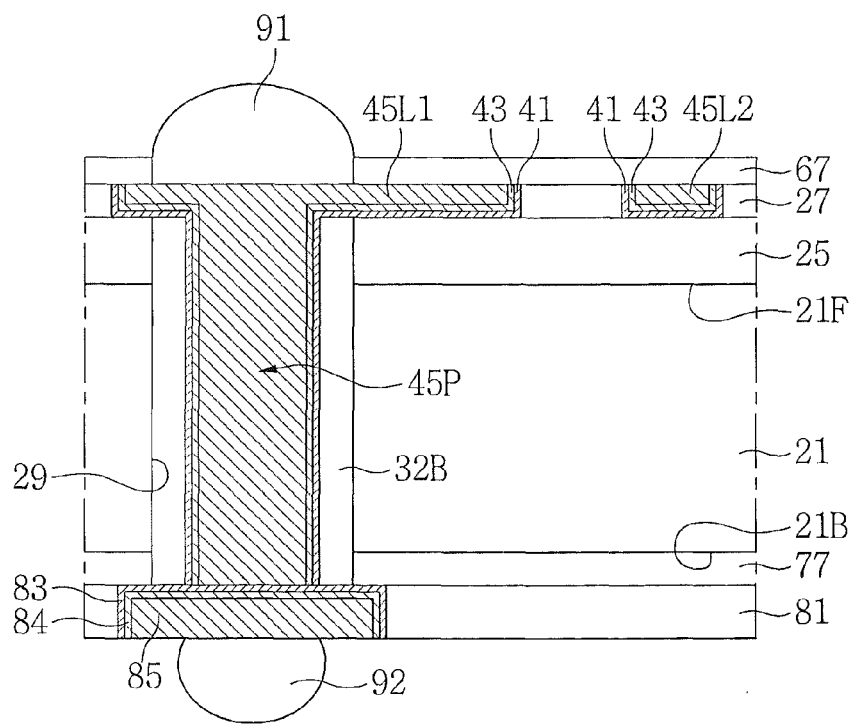

Referring to FIG. 8, a first connection terminal 91 may be formed on a first interconnection 45L1. A second connection terminal 92 may be formed on a seventh interconnection 85.

Figure 9:
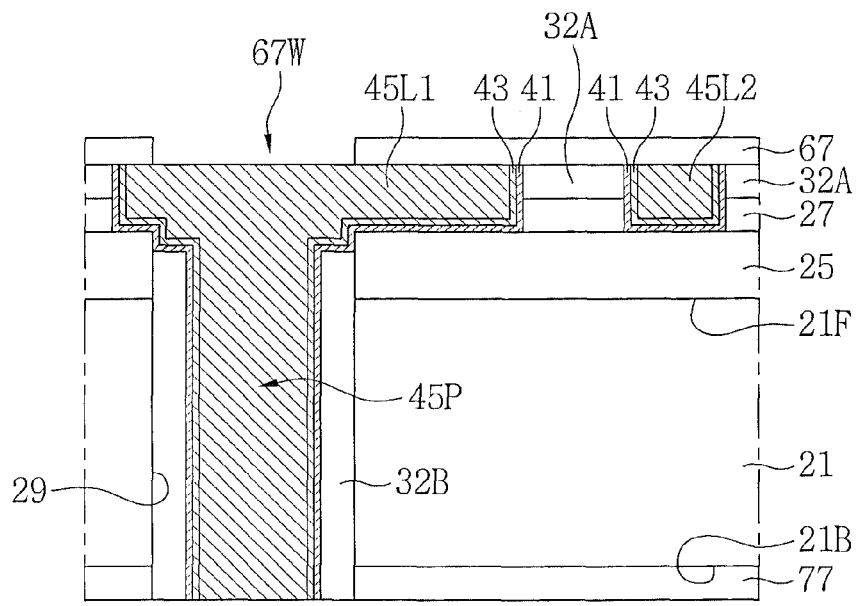

Referring to FIG. 9, a spacer 32B may be formed to a level lower than an upper surface of a first insulating layer 25. A first barrier layer 41 may be in contact with an upper surface of the spacer 32B and a side of the first insulating layer 25.

Figure 10:
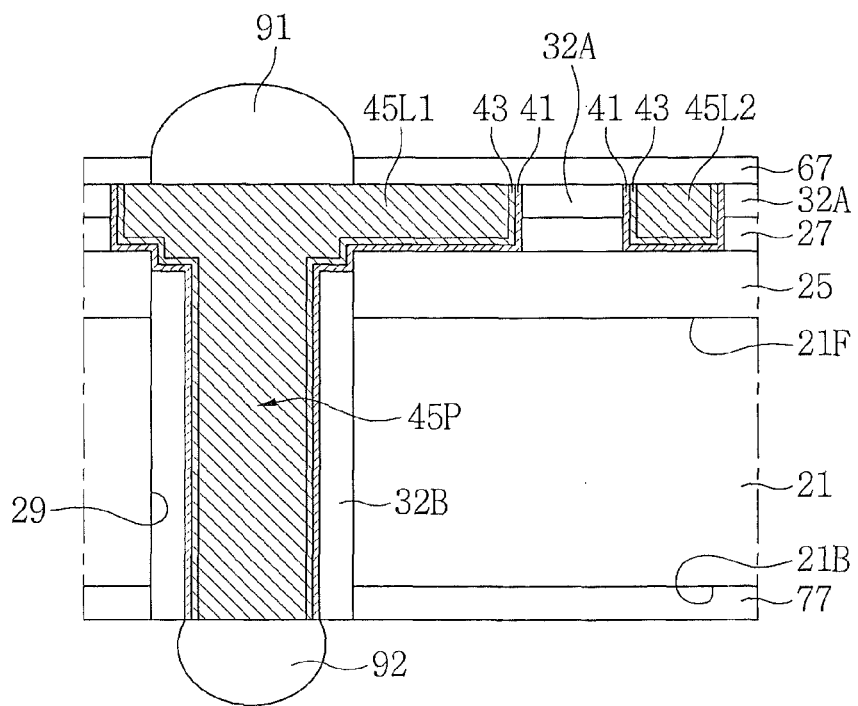

Referring to FIG. 10, a first connection terminal 91 may be formed on a first interconnection 45L1. A second connection terminal 92 connected to a bottom of a through electrode 45P may be formed.

Figure 11:
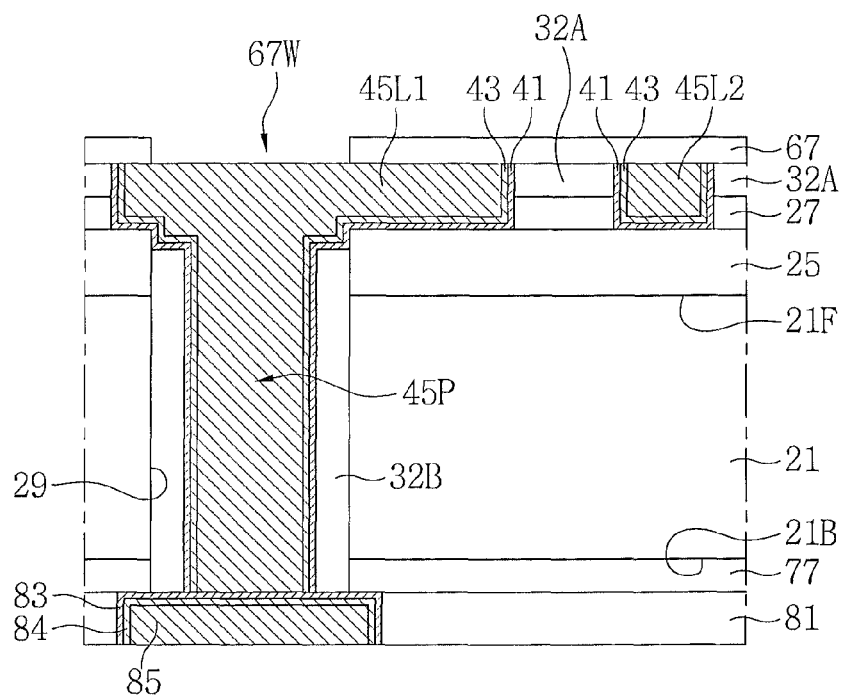

Referring to FIG. 11, a first barrier layer 41 may be in contact with an upper surface of a spacer 32B and a side of a first insulating layer 25. A tenth insulating layer 81 may be formed on a ninth insulating layer 77. A seventh interconnection 85 penetrating the tenth insulating layer 81 and connected to a bottom of a through electrode 45P may be formed. A side and an upper surface of the seventh interconnection 85 may be covered with a fourth seed layer 84 and a fourth barrier layer 83 sequentially stacked.

Figure 12:
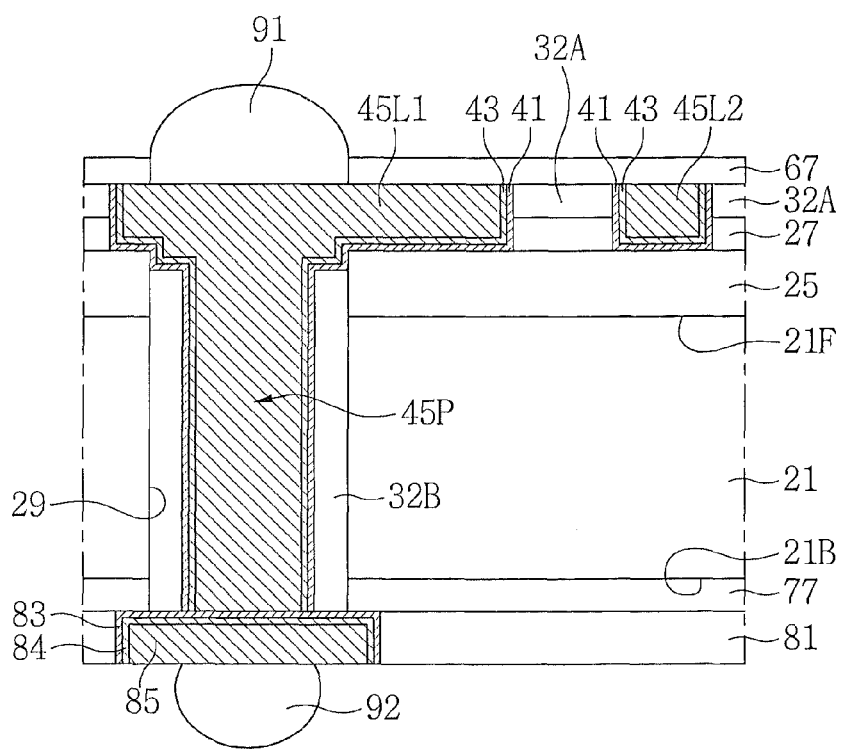

Referring to FIG. 12, a first connection terminal 91 may be formed on a first interconnection 45L1. A second connection terminal 92 may be formed on a seventh interconnection 85.

Figure 13:
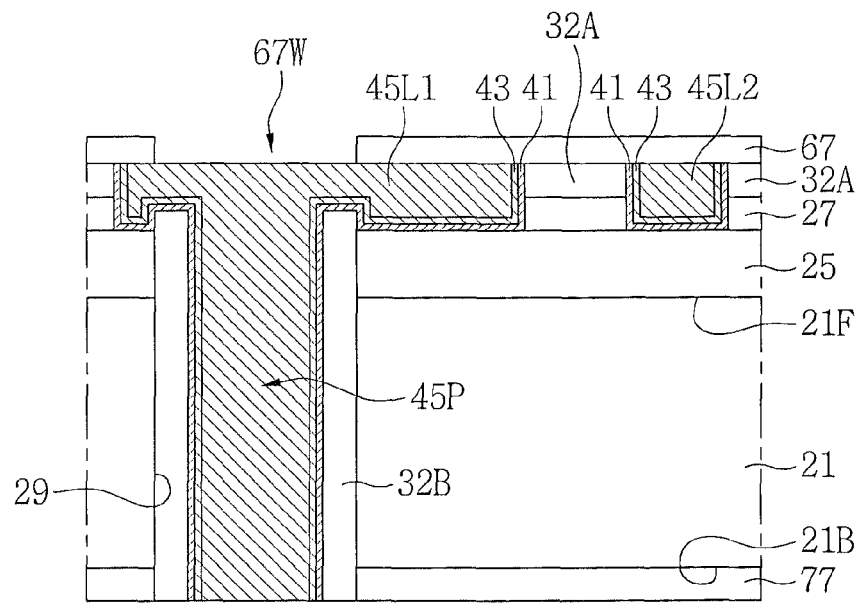

Referring to FIG. 13, an upper surface of a spacer 32B may protrude to a level higher than an upper surface of a first insulating layer 25. A first barrier layer 41 may be in contact with an upper surface and sides of the spacer 32B.

Figure 14:
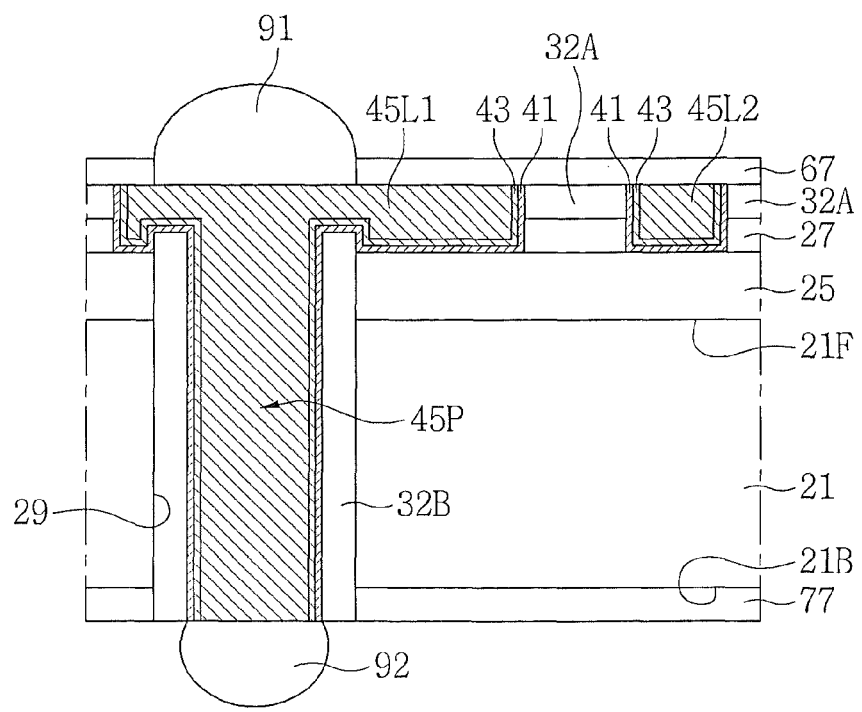

Referring to FIG. 14, a first connection terminal 91 may be formed on a first interconnection 45L1. A second connection terminal 92 connected to a bottom of a through electrode 45P may be formed.

Figure 15:
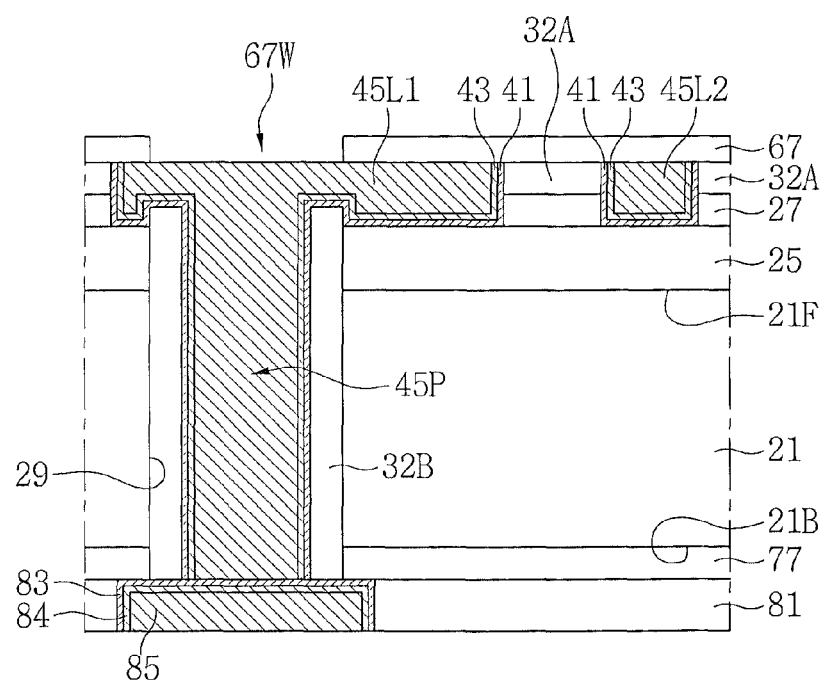

Referring to FIG. 15, a first barrier layer 41 may be in contact with an upper surface and sides of a spacer 32B. A seventh interconnection 85 penetrating a tenth insulating layer 81 and connected to a bottom of a through electrode 45P may be formed. A side and an upper surface of the seventh interconnection 85 may be covered with a fourth seed layer 84 and a fourth barrier layer 83 sequentially stacked.

Figure 16:
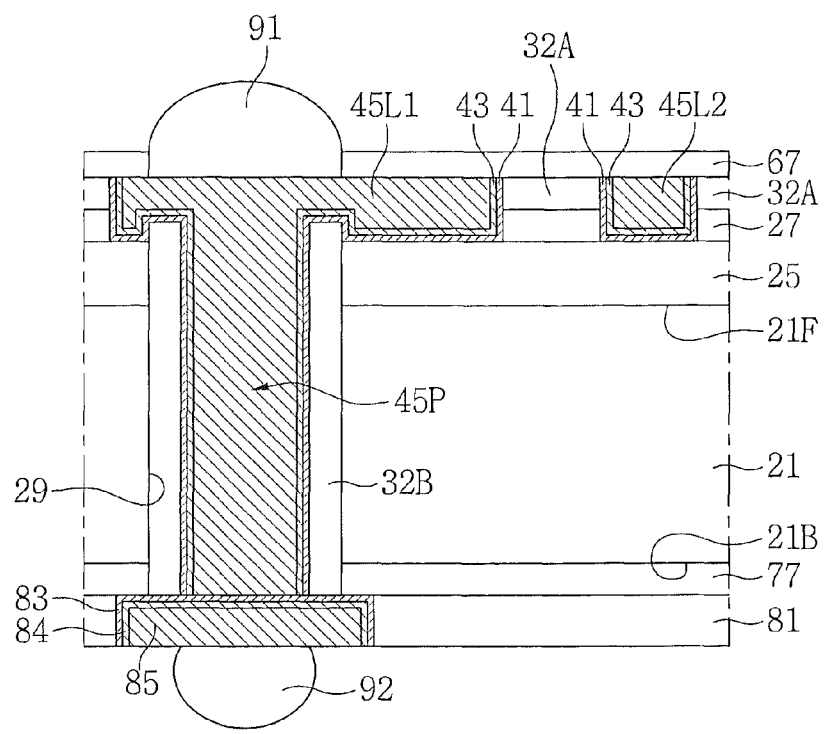

Referring to FIG. 16, a first barrier layer 41 may be in contact with an upper surface and sides of a spacer 32B. A first connection terminal 91 may be formed on a first interconnection 45L1. A second connection terminal 92 may be formed on a seventh interconnection 85.

Figure 17:
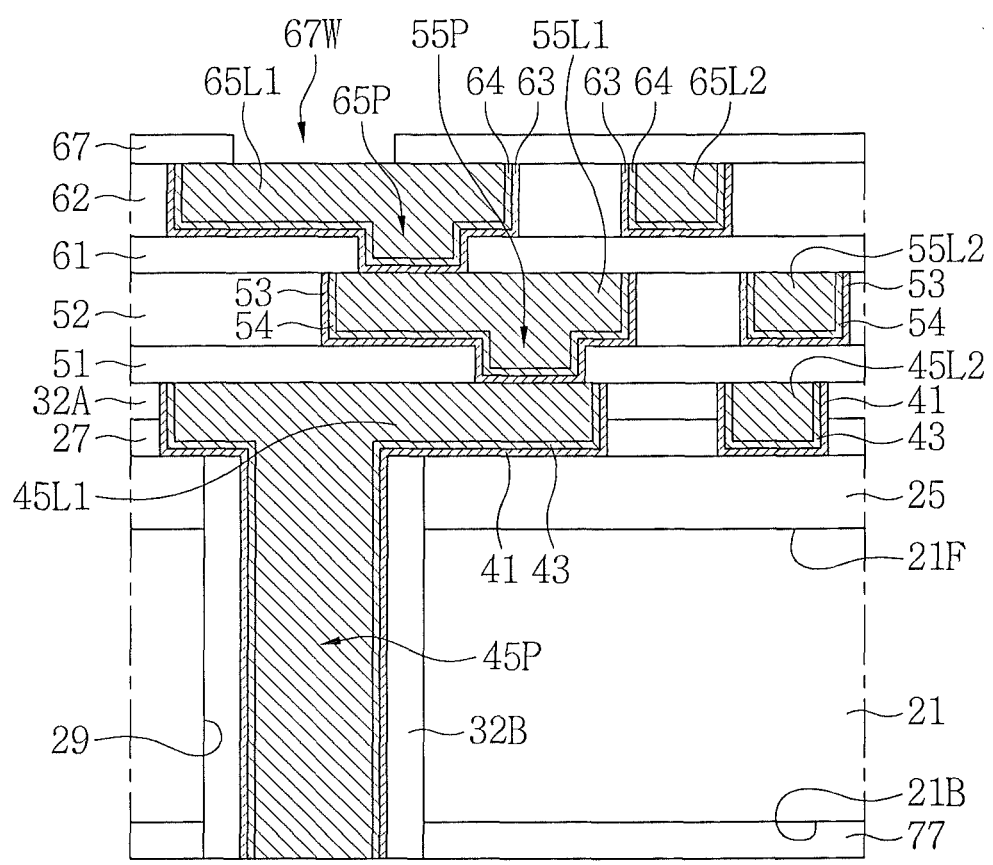

Referring to FIG. 17, a fourth insulating layer 51, a fifth insulating layer 52, a sixth insulating layer 61, and a seventh insulating layer 62 may be sequentially formed on a first interconnection 45L1 and a second interconnection 45L2. A first plug 55P penetrating the fourth insulating layer 51 and connected to the first interconnection 45L1 may be formed. A third interconnection 55L1 and a fourth interconnection 55L2 may be formed on the fourth insulating layer 51. A second barrier layer 53 and a second seed layer 54 sequentially stacked may be formed on sides and bottoms of the first plug 55P, the third interconnection 55L1, and the fourth interconnection 55L2.

A second plug 65P penetrating the sixth insulating layer 61 and connected to the third interconnection 55L1 may be formed. A fifth interconnection 65L1 and a sixth interconnection 65L2 may be formed on the sixth insulating layer 61. A third barrier layer 63 and a third seed layer 64 sequentially stacked may be formed on sides and bottoms of the second plug 65P, the fifth interconnection 65L1, and the sixth interconnection 65L2. An eighth insulating layer 67 covering the fifth interconnection 65L1 and the sixth interconnection 65L2 may be formed on the seventh insulating layer 62. A connection window 67W penetrating the eighth insulating layer 67 and exposing a portion of the fifth interconnection 65L1 may be formed.

Figure 18:
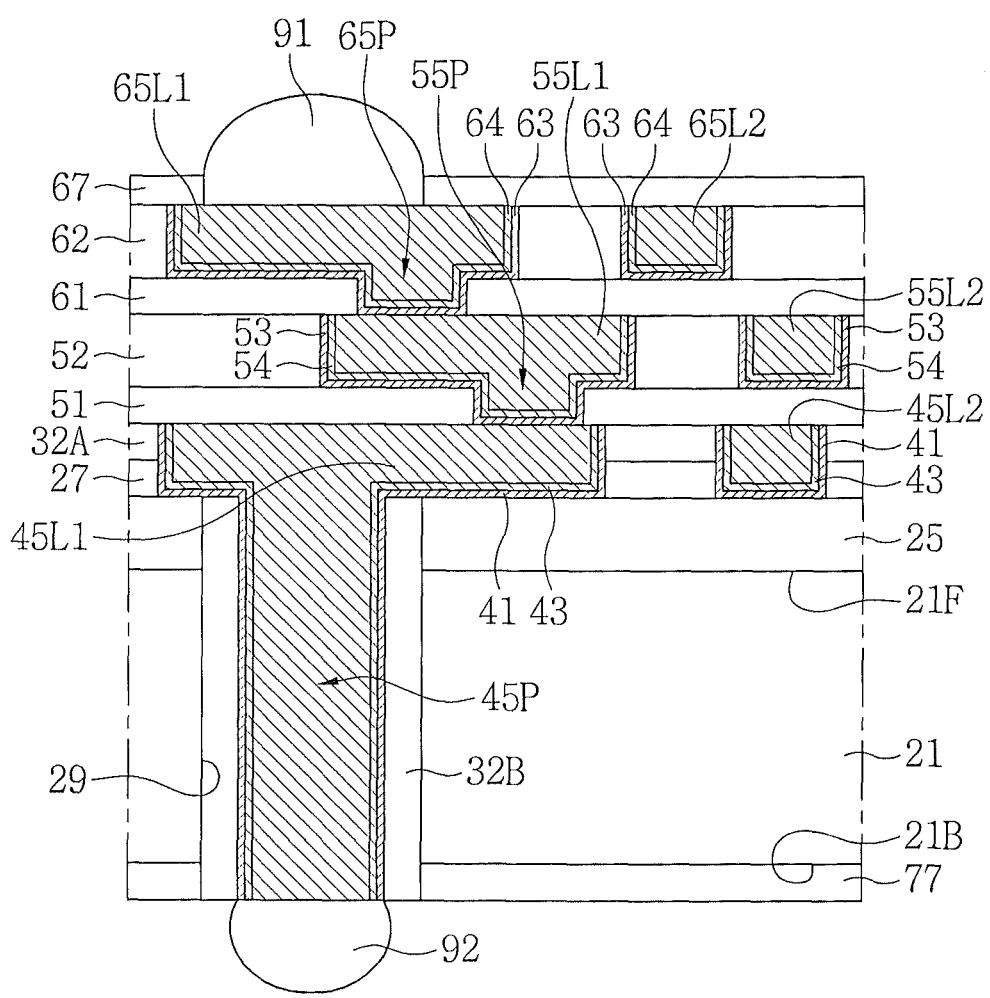

Referring to FIG. 18, a first connection terminal 91 penetrating an eighth insulating layer 67 and connected to a fifth interconnection 65L1 may be formed. A second connection terminal 92 connected to a bottom of a through electrode 45P may be formed.

Figure 19:
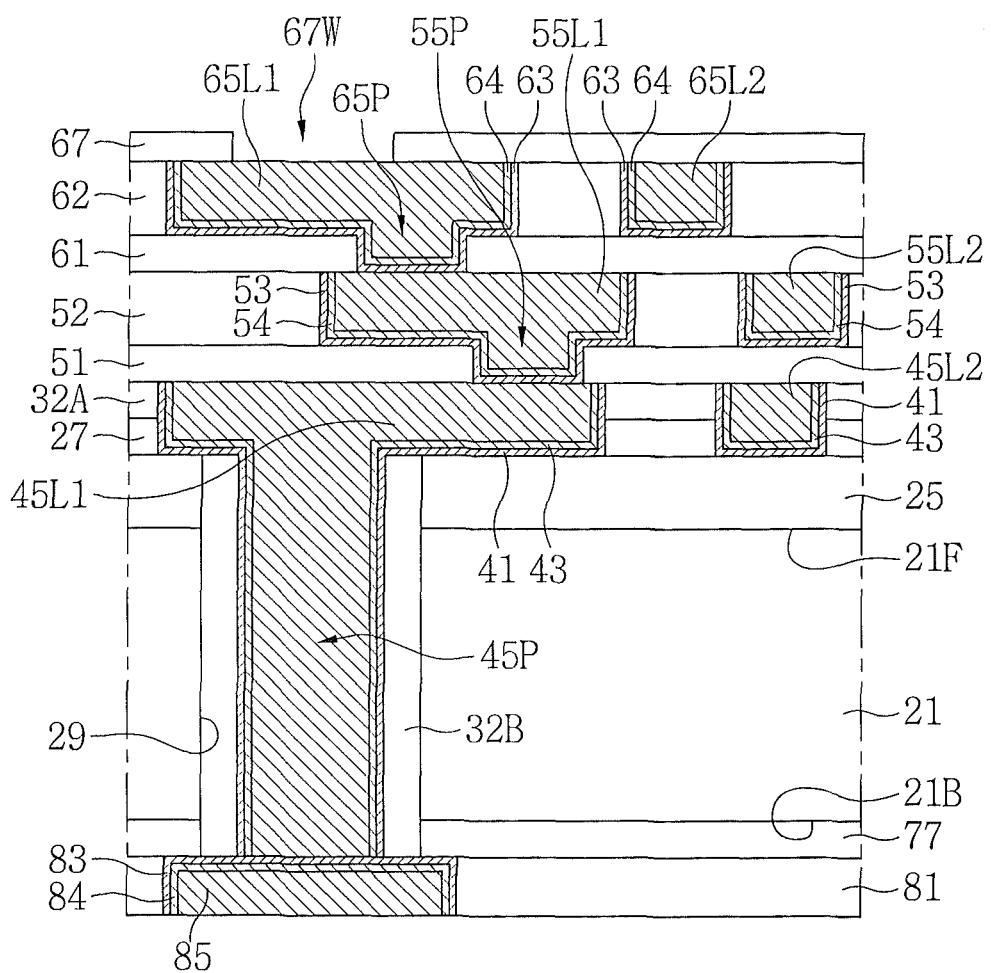

Referring to FIG. 19, a tenth insulating layer 81 may be formed on a ninth insulating layer 77. A seventh interconnection 85 penetrating the tenth insulating layer 81 and connected to a bottom of a through electrode 45P may be formed. A side and an upper surface of the seventh interconnection 85 may be covered with a fourth seed layer 84 and a fourth barrier layer 83 sequentially stacked.

Figure 20:
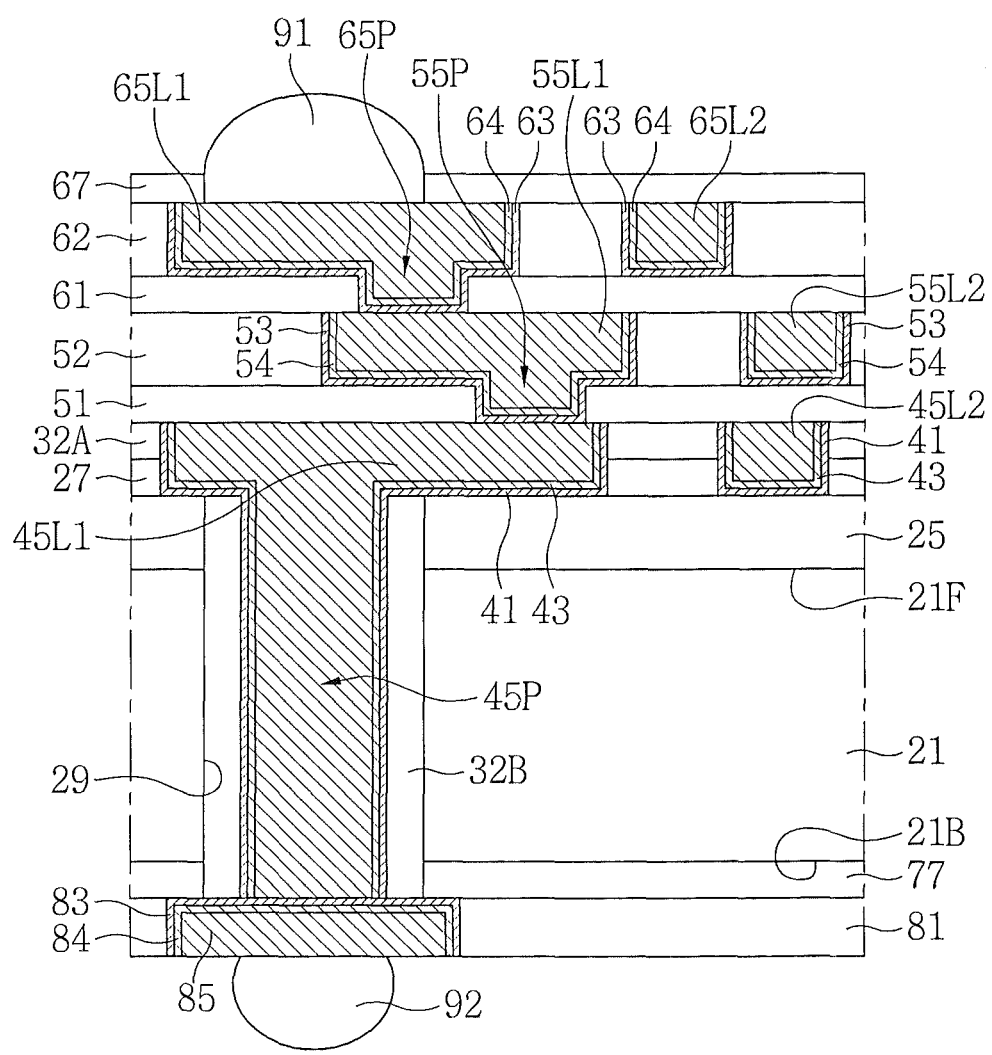

Referring to FIG. 20, a first connection terminal 91 penetrating an eighth insulating layer 67 and connected to a fifth interconnection 65L1 may be formed. A second connection terminal 92 may be formed on a seventh interconnection 85.

Figure 21:
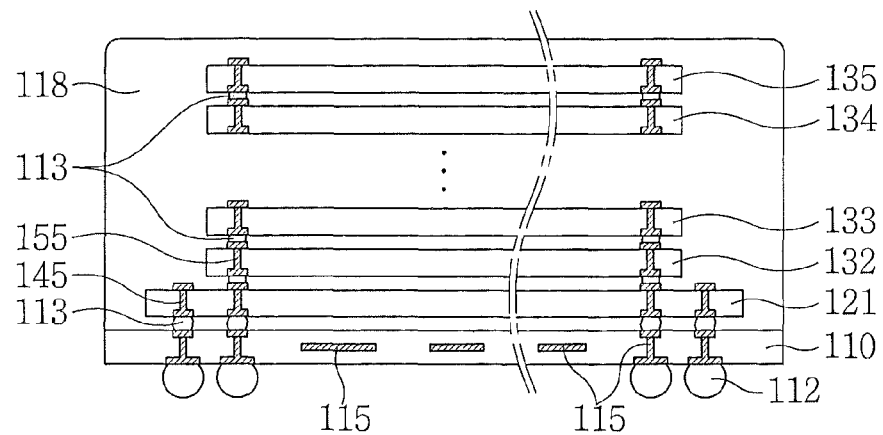
FIGS. 21 to 23 are cross-sections illustrating semiconductor packages adopting semiconductor devices according to some embodiments of the inventive concept.
Figure 22:
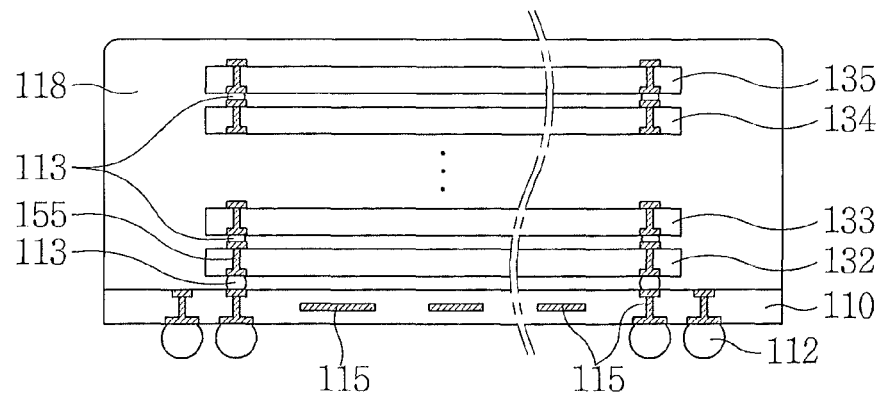
Figure 23:
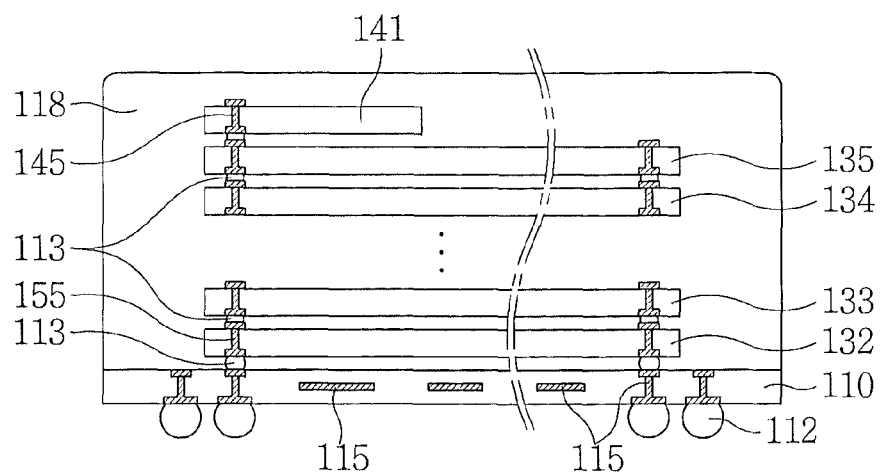

FIGS. 21 to 23 are cross-sections illustrating semiconductor packages adopting semiconductor devices according to some embodiments of the inventive concept. Referring first to FIG. 21, a first semiconductor chip 121 may be mounted on a package substrate 110. Second to fifth semiconductor chips 132, 133, 134, and 135 may be vertically stacked on the first semiconductor chip 121. An encapsulant 118 covering the first semiconductor chip 121 and the second to fifth semiconductor chips 132, 133, 134, and 135 may be formed on the package substrate 110. External connection terminals 112 may be formed on a bottom of the package substrate 110. The package substrate 110 may include internal interconnections 115. The first semiconductor chip 121 may include first through electrodes 145. Each of the second to fifth semiconductor chips 123, 133, 134, and 135 may include second through electrodes 155. The first through electrodes 145 and the second through electrodes 155 may be electrically connected to the internal interconnections 115 of the package substrate 110 by internal connection terminals 113.

The package substrate 110 may include a rigid printed circuit board (PCB), a flexible PCB, or a combination thereof. The internal interconnections 115 of the package substrate 110 may include a conductive material, such as copper (Cu). The external connection terminals 112 may be connected to the internal interconnections 115. Each of the external connection terminals 112 may include a solder ball, a conductive bump, a conductive paste, a lead grid array (LGA), a pin grid array (PGA), or a combination thereof. The encapsulant 118 may include a molding compound.

The first semiconductor chip 121 may have a size different from those of the second to fifth semiconductor chips 132, 133, 134, and 135. A horizontal width of the first semiconductor chip 121 may be larger than those of the second to fifth semiconductor chips 132, 133, 134, and 135. For example, the first semiconductor chip 121 may be a logic chip, such as a microprocessor, a controller, an application processor (AP), or a combination thereof. Each of the second to fifth semiconductor chips 132, 133, 134, and 135 may be a memory chip, such as a non-volatile memory or a volatile memory. Other semiconductor chips may be mounted between the third semiconductor chip 133 and the fourth semiconductor chip 134.

The first through electrodes 145 of the first semiconductor chip 121, and the second through electrodes 155 of the second to fifth semiconductor chips 132, 133, 134, and 135 may include a configuration similar to at least one of the through electrode 45P, the first interconnection 45L1, the fifth interconnection 65L1, and the seventh interconnection 85 described with reference to FIGS. 1 to 20. The internal connection terminals 113 may include a configuration similar to at least one of the first connection terminal 91 and the second connection terminal 92 described with reference to FIGS. 1 to 20. The internal connection terminals 113 may be formed between the first through electrodes 145 of the first semiconductor chip 121 and the internal interconnections 115 of the package substrate 110. The internal connection terminals 113 may be formed between the second through electrodes 155 of the second semiconductor chip 132 and the first through electrodes 145 of the first semiconductor chip 121. The internal connection terminals 113 may be formed between the second through electrodes of the second to fifth semiconductor chips 132, 1433, 134, and 135. The first semiconductor chip 121 and the second to fifth semiconductor chips 132, 133, 134, and 135 may be electrically connected to the external connection terminals 112 via the first through electrodes 145, the second through electrodes 155, the internal connection terminals 113, and the internal interconnections 115.

In some embodiments, the external connection terminals 112 may be omitted. The second to fifth semiconductor chips 132, 133, 134, and 135 may have a vertical stacking structure, a zigzag stacking structure, a cascade stacking structure, or a combination thereof.

Referring to FIG. 22, a second semiconductor chip 132 may be mounted on a package substrate 110. Third to fifth semiconductor chips 133, 134, and 135 may be vertically stacked on the second semiconductor chip 132. An encapsulant 118 covering the second to fifth semiconductor chips 132, 133, 134, and 135 may be formed on the package substrate 110. Each of the second to fifth semiconductor chips 132, 133, 134, and 135 may include second through electrodes 155. Each of the second to fifth semiconductor chips may be a memory chip, such as a non-volatile memory or a volatile memory. The second to fifth semiconductor chips 132, 133, 134, and 135 may be electrically connected to external connection terminals 112 via the second through electrodes 155, internal connection terminals 113, and internal interconnections 115.

Referring to FIG. 23, a second semiconductor chip 132 may be mounted on a package substrate 110. Third to fifth semiconductor chips 133, 134, and 135 may be vertically stacked on the second semiconductor chip 132. A sixth semiconductor chip 141 may be mounted on the fifth semiconductor chip 135. An encapsulant 118 covering the second to fifth semiconductor chips 132, 133, 134, and 135 and the sixth semiconductor chip 141 may be formed on the package substrate 110. The sixth semiconductor chip 141 may include a first through electrode 145. Each of the second to fifth semiconductor chips 132, 133, 134, and 135 may include second through electrodes 155.

Each of the second to fifth semiconductor chips 132, 133, 134, and 135 may be a memory chip, such as a non-volatile memory or a volatile memory. The sixth semiconductor chip 141 may have a size different from those of the second to fifth semiconductor chips 132, 133, 134, and 135. A horizontal width of the sixth semiconductor chip 141 may be smaller than those of the second to fifth semiconductor chips 132, 133, 134, and 135. For example, the sixth semiconductor chip 141 may be a logic chip, such as a microprocessor, a controller, an application processor (AP), or a combination thereof. The second to fifth semiconductor chips 132, 133, 134, and 135 and the sixth semiconductor chip 141 may be electrically connected to external connection terminals 112 via the first through electrode 145, the second through electrodes 155, internal connection terminals 113, and internal interconnections 115.

Figure 24:
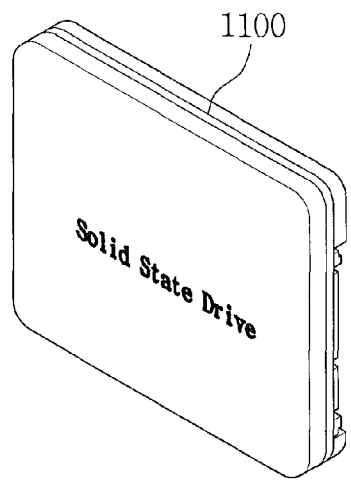
FIGS. 24 to 29 are views illustrating perspective views and system block diagrams of electronic apparatuses according to some embodiments of the inventive concept.
Figure 25:
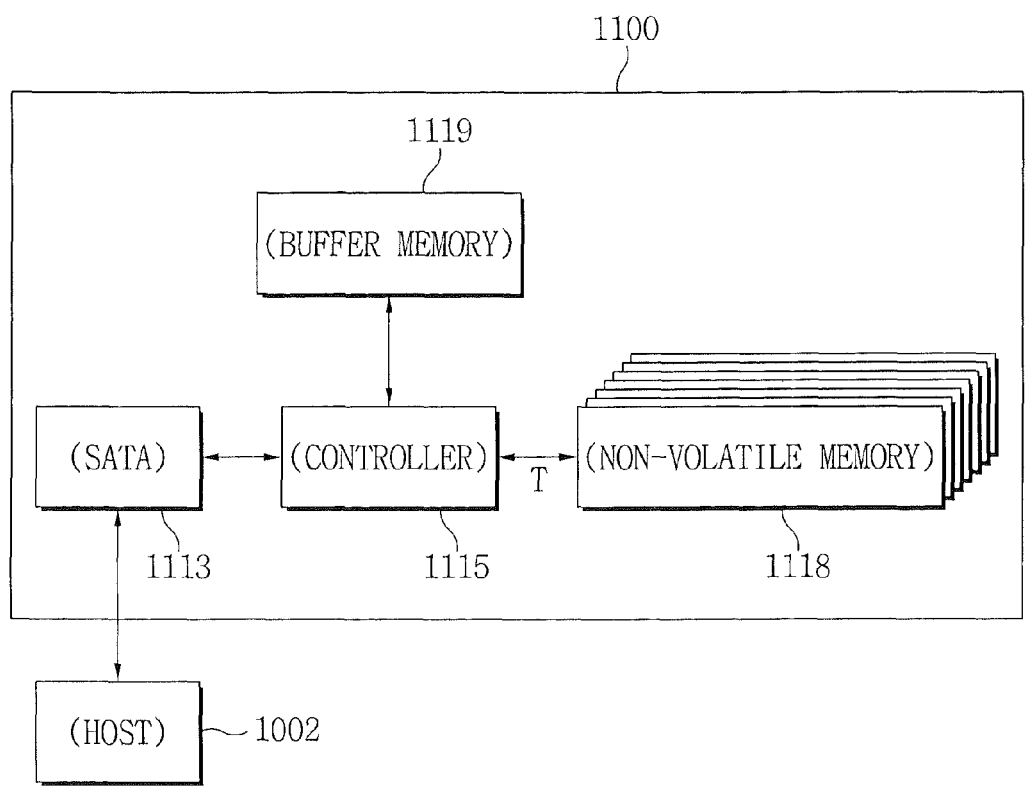

FIGS. 24 to 29 are perspective views and system block diagrams of electronic apparatuses according to some embodiments of the inventive concept. Referring first to FIGS. 24 and 25, an electronic apparatus according to an embodiment of the inventive concept may be a data storage device, such as a solid state drive (SSD) 1100. For example, the SSD 1100 may include an interface 1113, a controller 1115, a non-volatile memory 1118, and a buffer memory 1119. The SSD 1100 may be a device which stores information using a semiconductor device. The SSD 1100 is faster, has a lower mechanical delay or failure rate, and generates less heat and noise than a hard disk drive (HDD). Further, the SSD 1100 may be smaller and lighter than the HDD. The SSD 1100 may be widely used in a laptop computer, a netbook, a desktop PC, an MPEG-1 audio layer 3 (MP3) player, or a portable storage device.

The controller 1115 may be formed close to the interface 1113 and electrically connected thereto. The controller 1115 may be a microprocessor including a memory controller and a buffer controller. The non-volatile memory 1118 may be formed close to the controller 1115 and electrically connected thereto. Data storage capacity of the SSD 1100 may correspond to the capacity of the non-volatile memory 1118. The buffer memory 1119 may be formed close to the controller 1115 and electrically connected thereto.

The interface 1113 may be connected to a host 1002, and may send and receive electrical signals, such as data. For example, the interface 1113 may be a device using a standard, such as a Serial Advanced Technology Attachment (SATA), an Integrated Drive Electronics (IDE), a Small Computer System Interface (SCSI), and/or a combination thereof. The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be a dynamic random access memory (DRAM) and/or a static random access memory (SRAM). The buffer memory 1119 has relatively faster operating speed than the non-volatile memory 1118.

Data processing speed of the interface 1113 may be relatively faster than the operating speed of the non-volatile memory 1118. Here, the buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently-used items of the data stored in the non-volatile memory 1118 may be pre-read and temporarily stored in the buffer memory 1119. That is, the buffer memory 1119 may function to increase effective operating speed of the SSD 1100, and reduce error rate.

Some or all of the non-volatile memory 1118, the buffer memory 1119, and the controller 1115 may have a configuration similar to the configuration described with reference to FIGS. 1 to 23. For example, the non-volatile memory 1118 may have a configuration similar to at least one of the through electrode 45P, the first interconnection 45L1, the fifth interconnection 65L1, and the seventh interconnection 85. Electrical characteristics of the SSD 1100 may be considerably improved as compared with the related art.

Figure 26:
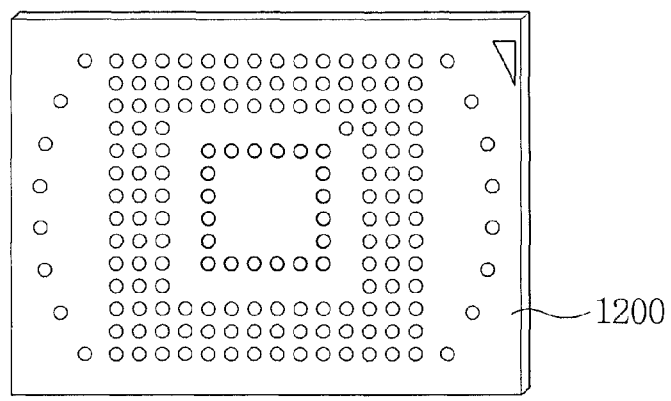
Figure 27:
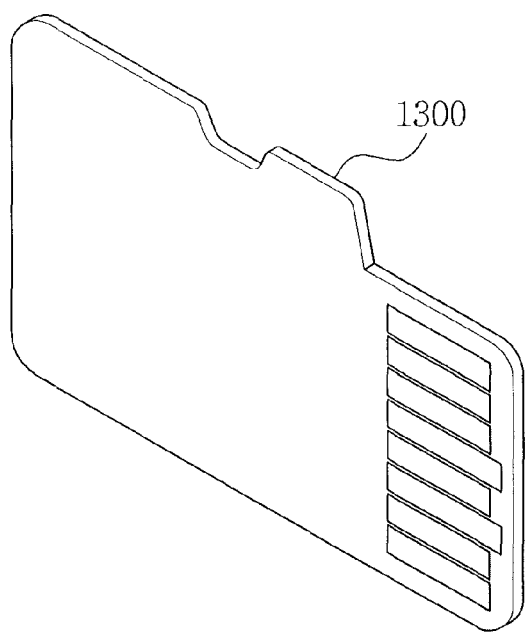
Figure 28:
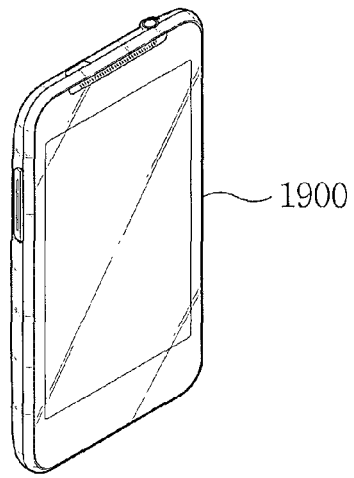

Referring to FIGS. 26 to 28, the semiconductor devices described with reference to FIGS. 1 to 23 may be usefully applied to electronic systems, such as an embedded multimedia chip (eMMC) 1200, a micro secure digital (SD) 1300, a smart phone 1900, a netbook, a laptop computer, or a tablet PC. For example, a semiconductor device similar to the semiconductor devices described with reference to FIGS. 1 to 23 may be installed in a main board of the smart phone 1900. The semiconductor device similar to the semiconductor devices described with reference to FIGS. 1 to 23 may be provided to an expansion apparatus, such as the micro SD 1300, and used through a combination with the smart phone 1900.

Figure 29:
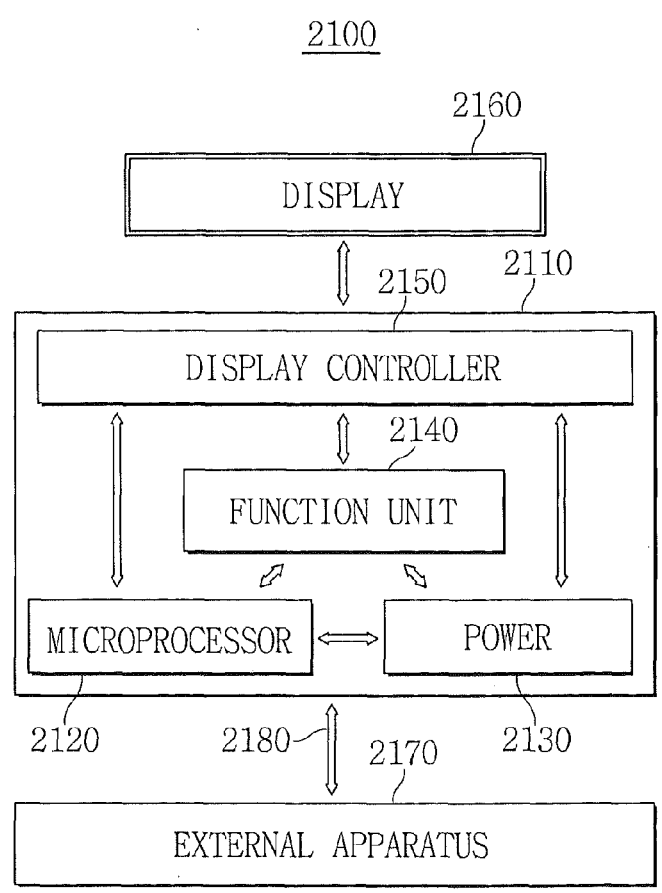

Referring to FIG. 29, a semiconductor device similar to the semiconductor devices described with reference to FIGS. 1 to 23 may be applied to an electronic system 2100. The electronic system 2100 may include a body 2110, a microprocessor unit 2120, a power unit 2130, a function unit 2140, and a display controller unit 2150. The body 2110 may be a motherboard formed of a PCB. The microprocessor unit 2120, the power unit 2130, the function unit 2140, and the display controller unit 2150 may be installed on the body 2110. A display unit 2160 may be disposed inside or outside the body 2110. For example, the display unit 2160 may be arranged on a surface of the body 2110 and display an image processed by the display controller unit 2150.

The power unit 2130 may receive a constant voltage from an external battery (not shown), etc., divide the voltage into various levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may have several components which perform functions of the mobile phone such as output of an image to the display unit 2160 or output of a voice to a speaker, by dialing or communication with an external apparatus 2170. If a camera is installed, the function unit 2140 may function as a camera image processor.

In some embodiments, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

A semiconductor device similar to the semiconductor devices described with reference to FIGS. 1 to 23 may be applied to the function unit 2140 or the microprocessor unit 2120. For example, the function unit 2140 may include a configuration similar to at least one of the through electrode 45P, the first interconnection 45L1, the fifth interconnection 65L1, and the seventh interconnection 85. The through electrode 45P may be electrically connected to the body 2110. The electronic system 2100 may become lighter, thinner, shorter, and smaller, and have good electrical characteristics.

Figure 30:
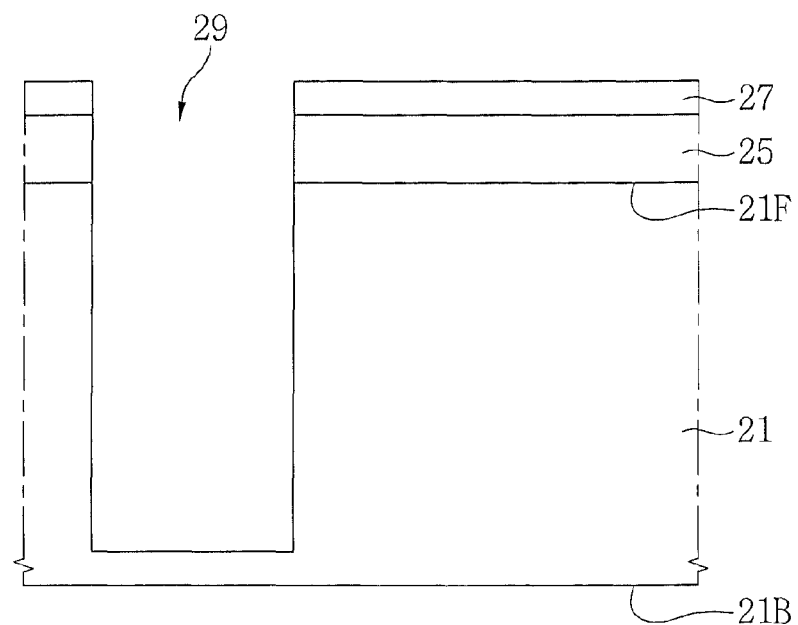
FIGS. 30 to 48 are cross-sections illustrating processing steps in the fabrication of semiconductor devices according to some embodiments of the inventive concept.

FIGS. 30 to 48 are cross-sections illustrating a method of forming a semiconductor device according to embodiments of the inventive concept. Referring first to FIG. 30, a first insulating layer 25 and a second insulating layer 27 may be sequentially formed on a substrate 21. A front side 21F and a rear side 21B may be defined in the substrate 21. A through hole 29 penetrating the second insulating layer 27, the first insulating layer 25, and the front side 21F may be formed.

The substrate 21 may be a semiconductor substrate, such as a silicon wafer or a silicon on insulator (SOI) wafer. Various kinds of active devices and/or passive devices may be formed on or in the front side 21F, and for clarity; detailed description thereof will be omitted. The front side 21F may be covered with the first insulating layer 25. The first insulating layer 25 may include silicon oxide, silicon nitride, silicon oxynitride, or a combination thereof. The second insulating layer 27 may cover the first insulating layer 25. The second insulating layer 27 may include silicon oxide, silicon nitride, silicon oxynitride, or a combination thereof. The second insulating layer 27 may include a material having etch selectivity to the first insulating layer 25. For example, the first insulating layer 25 may be silicon oxide, and the second insulating layer 27 may be silicon nitride. The through hole 29 may sequentially penetrate the second insulating layer 27 and the first insulating layer 25, and extend into the inside of the substrate 21. The through hole 29 may be vertically aligned with the front side 21F of the substrate 21. For example, a horizontal width of the through hole 29 may be in a range of from about 3.0 μm to about 10 μm, and a vertical depth thereof may be in a range of from about 30 μm to about 100 μm. The substrate 21 may be exposed in a side and a bottom of the through hole 29. The through hole 29 may be formed using a patterning process, a laser drill process, or a combination thereof.

In some embodiments, the substrate 21 may be an interposer, such as a glass interposer. The substrate 21 may include silicon oxide. The horizontal width of the through hole 29 may be in a range of from about 10 μm to about 100 μm, and a vertical depth thereof may be in a range of from about 100 μm to about 600 μm.

Figure 31:
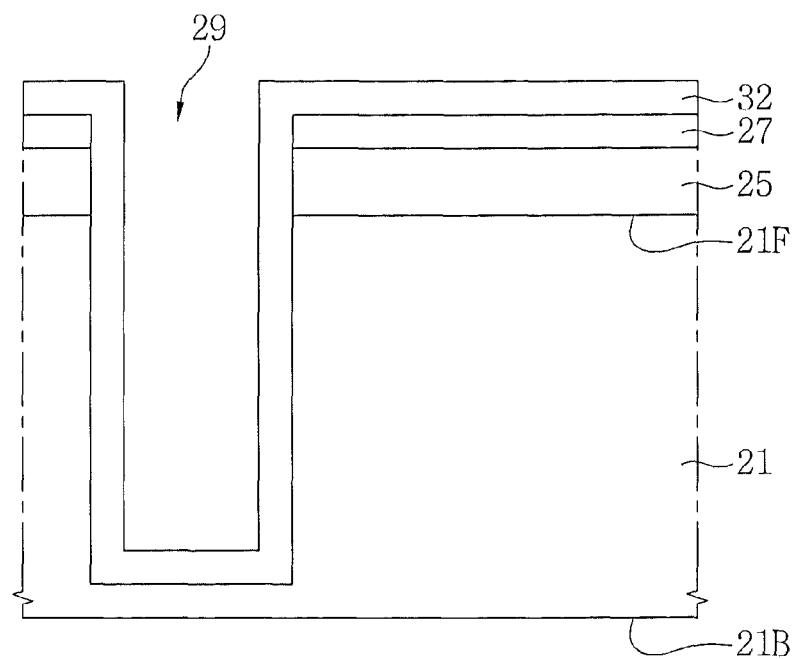

Referring to FIG. 31, a third insulating layer 32 covering the side and bottom of the through hole 29 and the second insulating layer 27 may be formed. The third insulating layer 32 may include silicon oxide, silicon nitride, silicon oxynitride, or a combination thereof. The third insulating layer 32 may include a material having etch selectivity to the second insulating layer 27. For example, the third insulating layer 32 may include silicon oxide, and the second insulating layer 27 may include silicon nitride. A thickness of the third insulating layer 32 may be in a range of 200 µm to 300 µm.

In some embodiments, the thickness of the third insulating layer 32 may be about 200 µm or less without departing from the scope of the present inventive concept.

Figure 32:
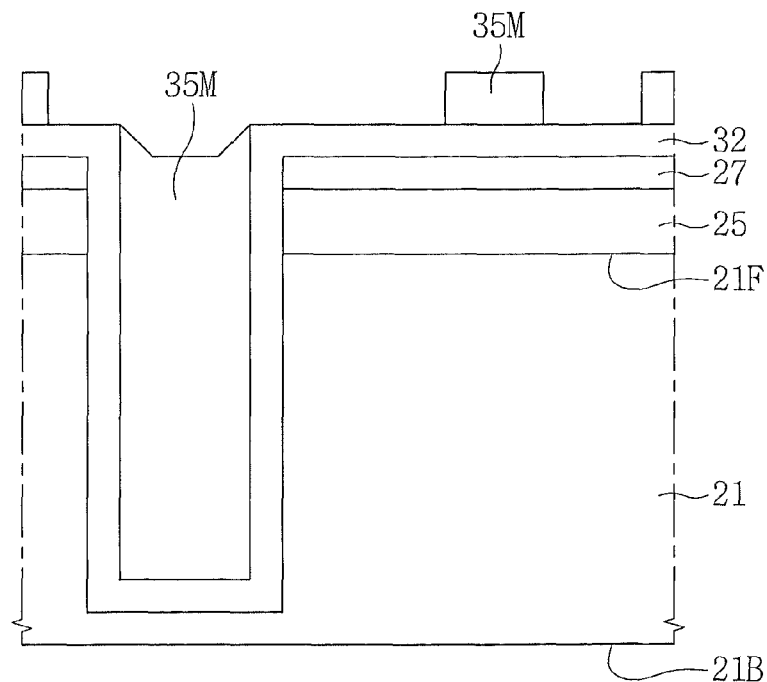

Referring to FIG. 32, a mask pattern 35M may be formed on the third insulating layer 32. The mask pattern 35M may fill the inside of the through hole 29 and partially cover the third insulating layer 32. The forming of the third insulating layer 32 may include performing a photo process and a developing process.

Figure 33:
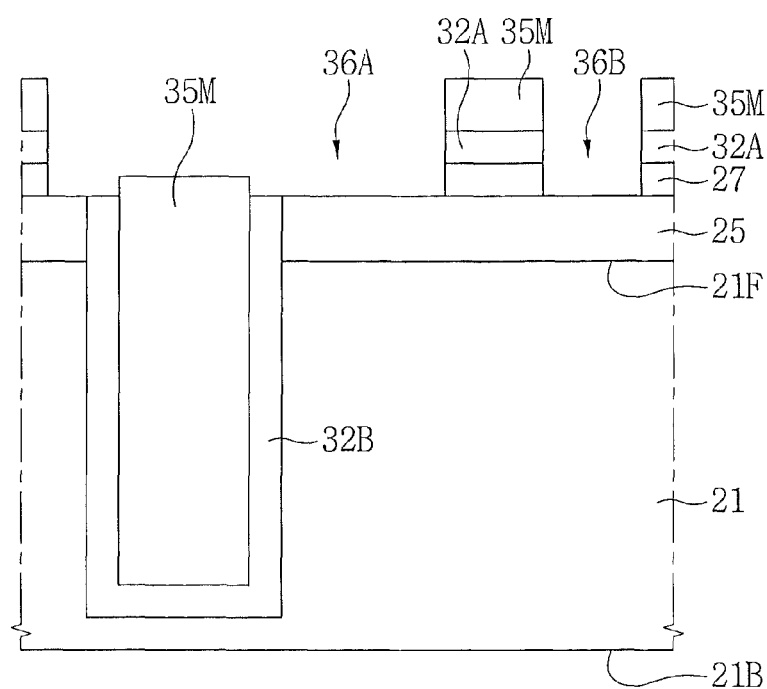

Referring to FIG. 33, the third insulating layer 32 and the second insulating layer 27 may be partially removed using the mask pattern 35M as an etch mask to form a first trench 36A and a second trench 36B. The second trench 36B may be formed to be spaced from the first trench 36A. The first insulating layer 25 may be exposed in bottoms of the first trench 36A and the second trench 36B. The first trench 36A may have a horizontal width larger than that of the through hole 29. The first trench 36A may traverse a top of the through hole 29.

The third insulating layer 32 may be divided into an interline insulating pattern 32A and a spacer 32B by the first trench 36A and the second trench 36B. The spacer 32B may be retained on a sidewall and a bottom of the through hole 29. The spacer 32B may be interposed between the mask pattern 35M and the substrate 21. In the bottom of the first trench 36A, an upper surface of the spacer 32B may be exposed substantially to the same level as the first insulating layer 25. The second insulating layer 27 may be retained between the first trench 36A and the second trench 36B. The interline insulating pattern 32A may be retained between the second insulating layer 27 and the mask pattern 35M. The interline insulating pattern 32A may cover an upper surface of the second insulating layer 27.

Figure 34:
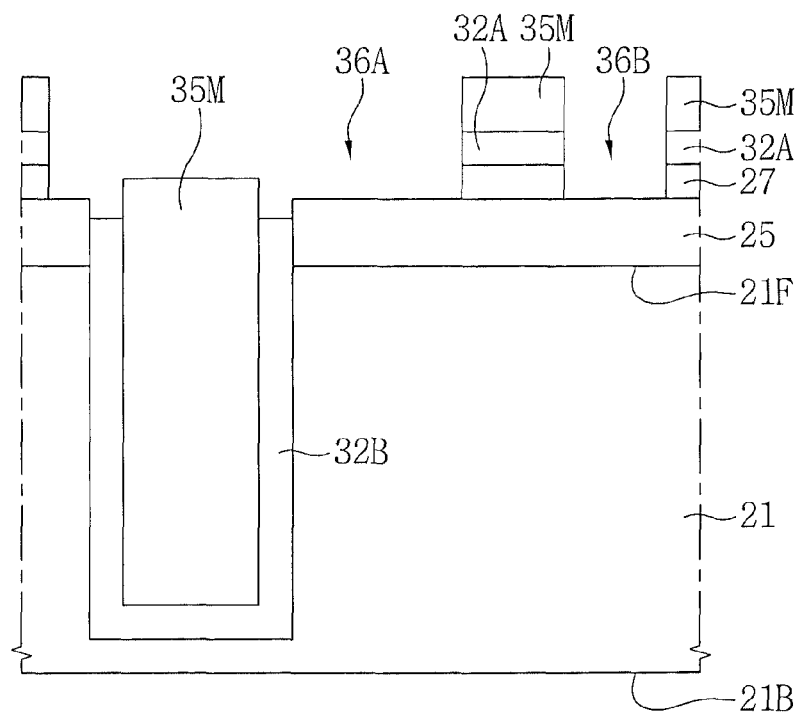

Referring to FIG. 34, an upper surface of the spacer 32B may be formed to a level lower than that of the first insulating layer 25.

Figure 35:
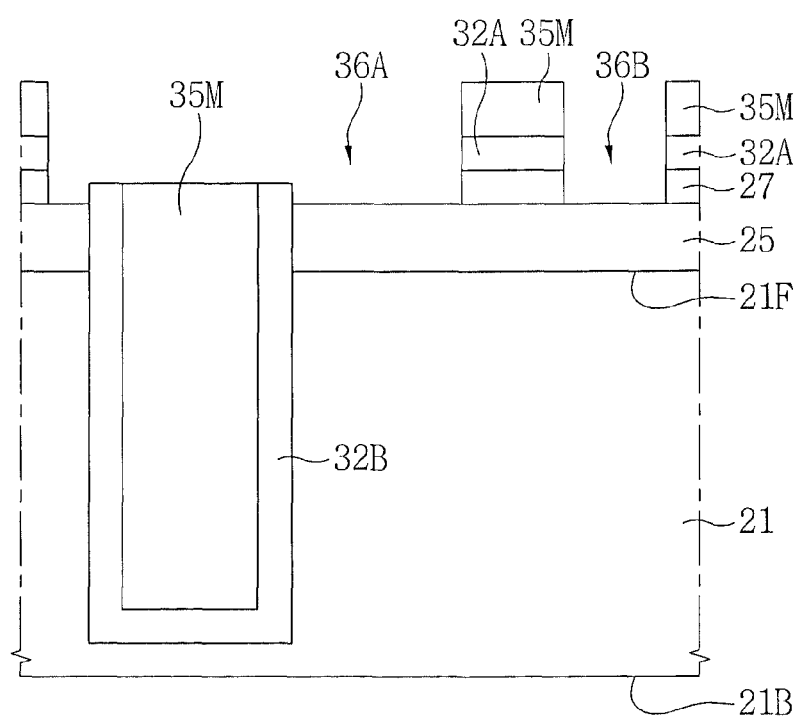

Referring to FIG. 35, an upper surface of the spacer 32B may protrude to a level higher than that of the first insulating layer 25.

Figure 36:
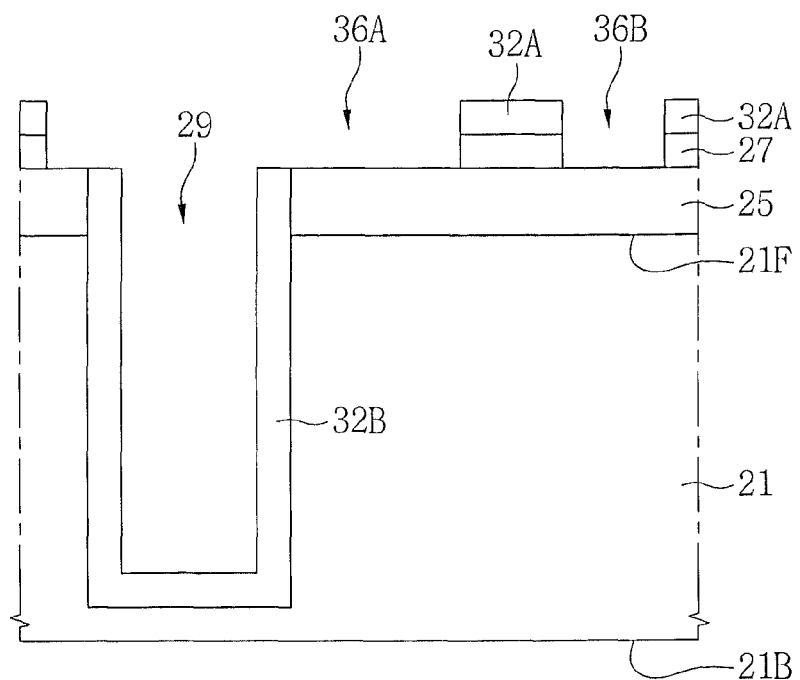

Referring to FIG. 36, the mask pattern 35M may be removed to expose the interline insulating pattern 32A and the spacer 32B. The through hole 29 may be connected to the bottom of the first trench 36A.

Figure 37:
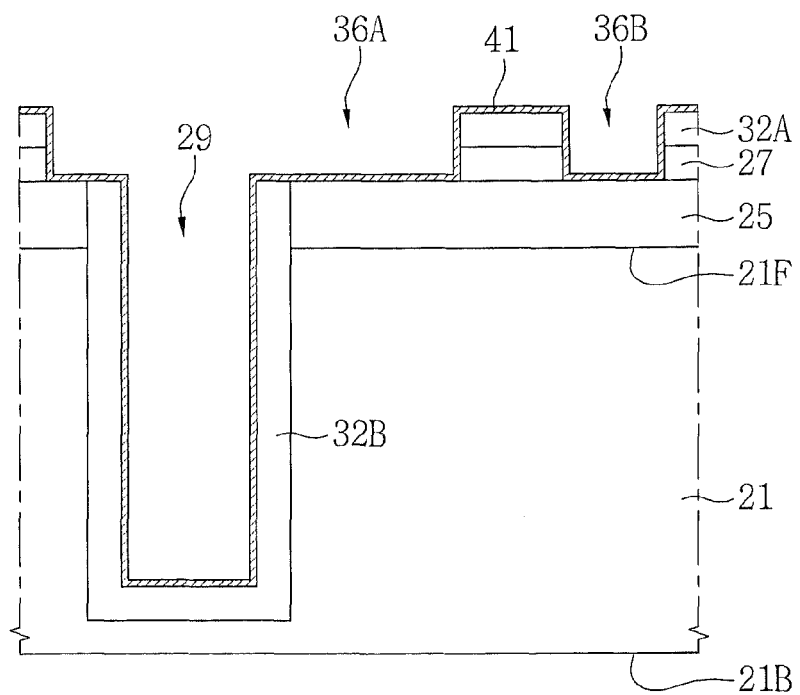

Referring to FIG. 37, a first barrier layer 41 conformally covering a surface of the substrate 21 may be formed. The first barrier layer 41 is formed in one body. The first barrier layer 41 may cover inner walls of the through hole 29, the first trench 36A, and the second trench 36B to a certain thickness. The first barrier layer 41 may be in contact with the first insulating layer 25, the second insulating layer 27, the interline insulating pattern 32A, and the spacer 32B. The first barrier layer 41 may include titanium (Ti), titanium nitride (TiN), tantalum (Ta), tantalum nitride (TaN), or a combination thereof. For example, the first barrier layer 41 may include TaN and Ta sequentially formed.

Figure 38:
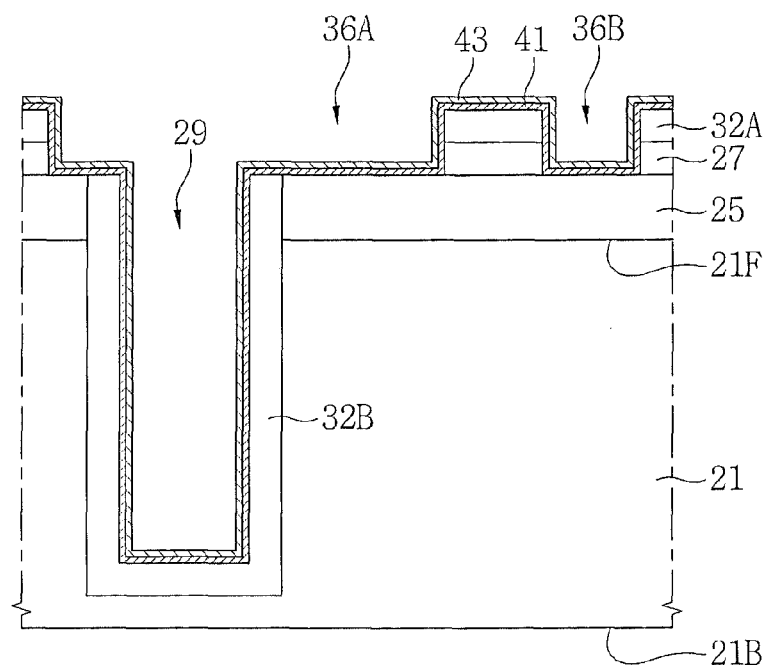

Referring to FIG. 38, a first seed layer 43 may be formed on the first barrier layer 41. The first seed layer 43 may be a conductive layer, such as copper (Cu) or ruthenium (Ru). In some embodiments, the first seed layer 43 may be omitted without departing from the scope of the present inventive concept.

Figure 39:
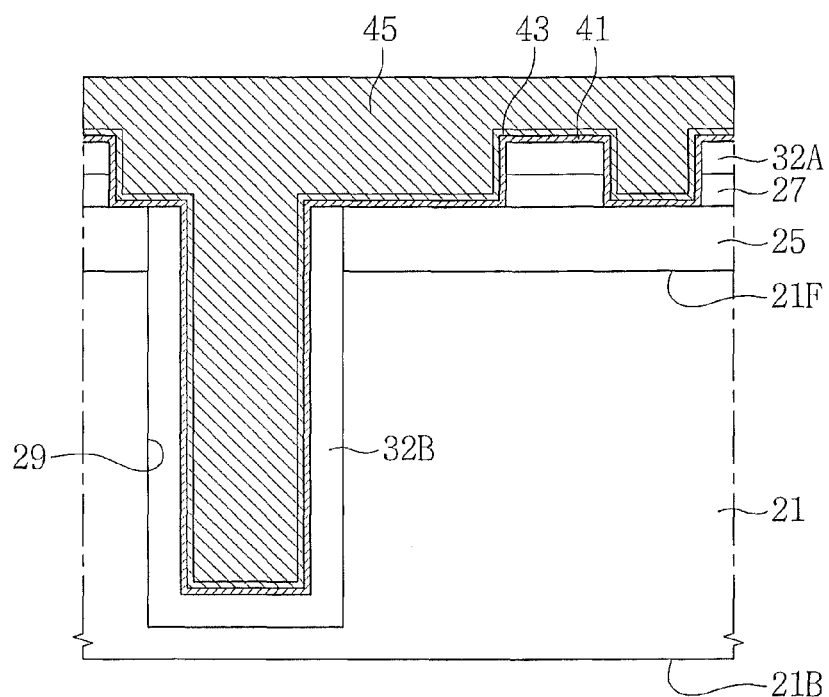

Referring to FIG. 39, the first conductive layer 45 may be formed on the first seed layer 43. The first conductive layer 45 may include a Cu layer using an electroplating method. The first conductive layer 45 may fully fill the through hole 29, the first trench 36A, and the second trench 36B, and cover the surface of the substrate 21.

Figure 40:
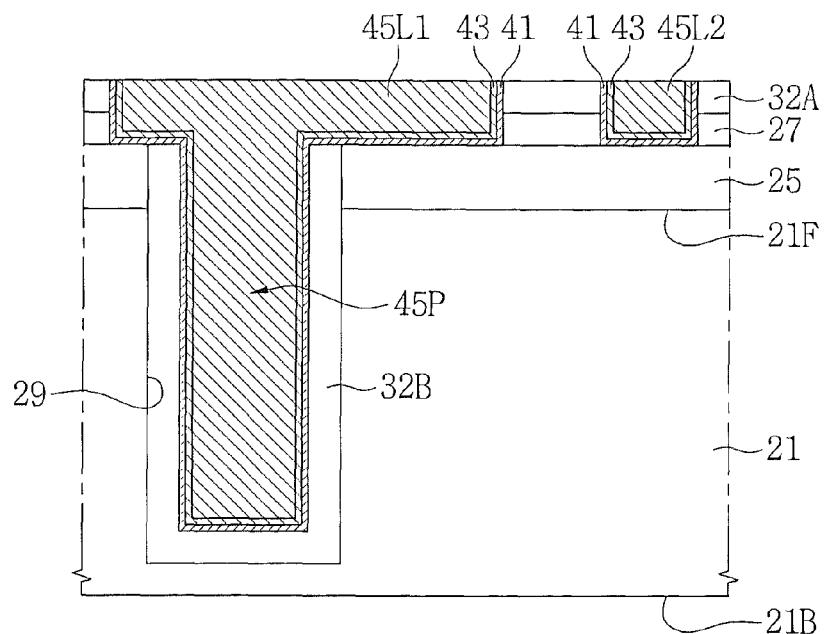

Referring to FIG. 40, the first conductive layer 45 may be planarized to form a first interconnection 45L1, a second interconnection 45L2, and the through electrode 45P. The planarization of the first conductive layer 45 may include performing a chemical mechanical polishing (CMP) process, an etch-back process, or a combination thereof. Upper surfaces of the first conductive layer 45 and the interline insulating pattern 32A may be exposed substantially to the same level as each other.

The first interconnection 45L1 may be formed in the first trench 36A. The second interconnection 45L2 may be formed in the second trench 36B. The through electrode 45P may be formed in the through hole 29. The through electrode 45P may be in continuity with the first interconnection 45L1. The through electrode 45P and the first interconnection 45L1 may have a continuous grain structure. The first seed layer 43 and the first barrier layer 41 are not interposed between the through electrode 45P and the first interconnection 45L1.

The first barrier layer 41 may be retained on sides and bottoms of the through electrode 45P, the first interconnection 45L1, and the second interconnection 45L2. The first seed layer 43 may be retained between the first barrier layer 41 and the through electrode 45P, between the first barrier layer 41 and the first interconnection 45L1, and between the first barrier layer 41 and the second interconnection 45L2. The second insulating layer 27 and the interline insulating pattern 32A may be retained between the first interconnection 45L1 and the second interconnection 45L2.

Figure 41:
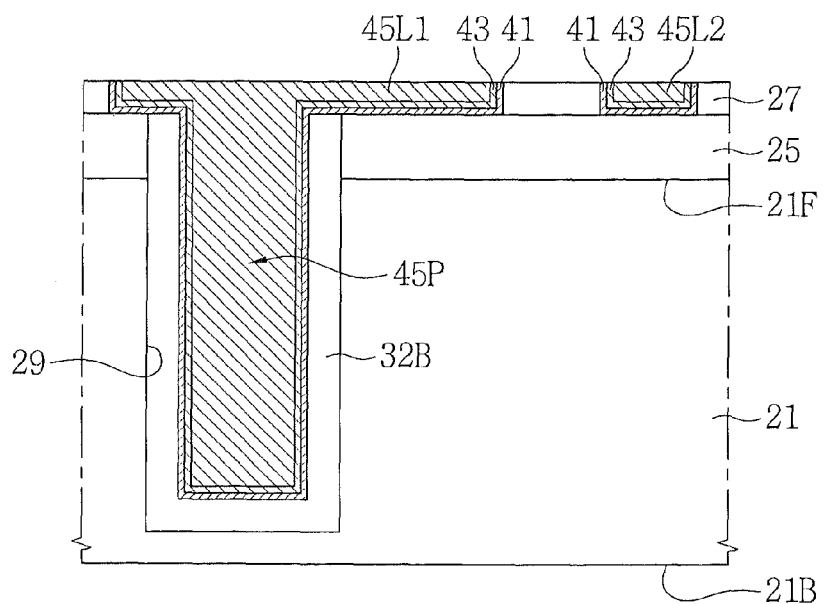

Referring to FIG. 41, upper surfaces of the first interconnection 45L1 and the second insulating layer 27 may be exposed substantially to the same level as each other. The interline insulating pattern 32A may be completely removed.

Figure 42:
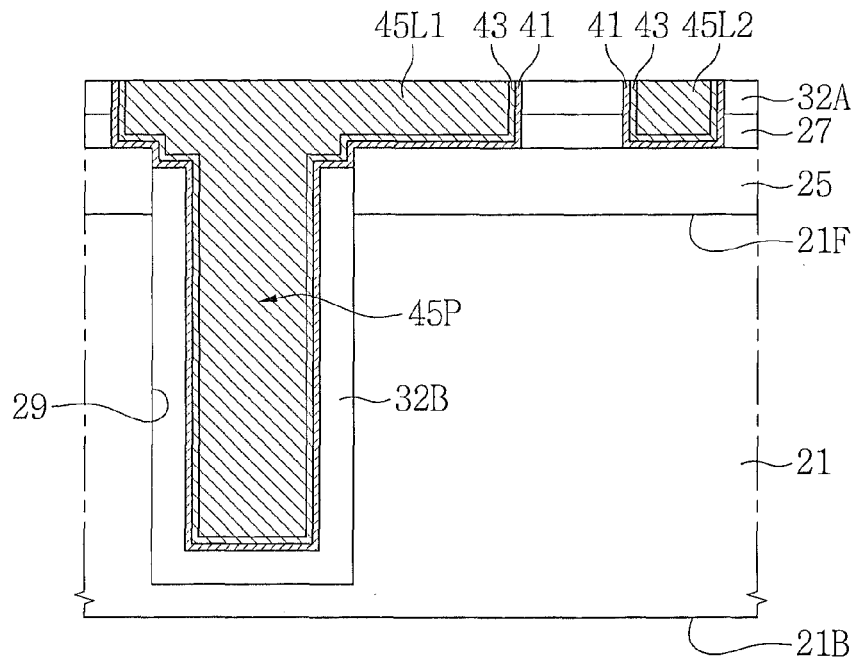

Referring to FIG. 42, when the spacer 32B is formed to a level lower than an upper surface of the first insulating layer 25, the first barrier layer 41 may be in contact with an upper surface of the first spacer 32B and a side of the first insulating layer 25.

Figure 43:
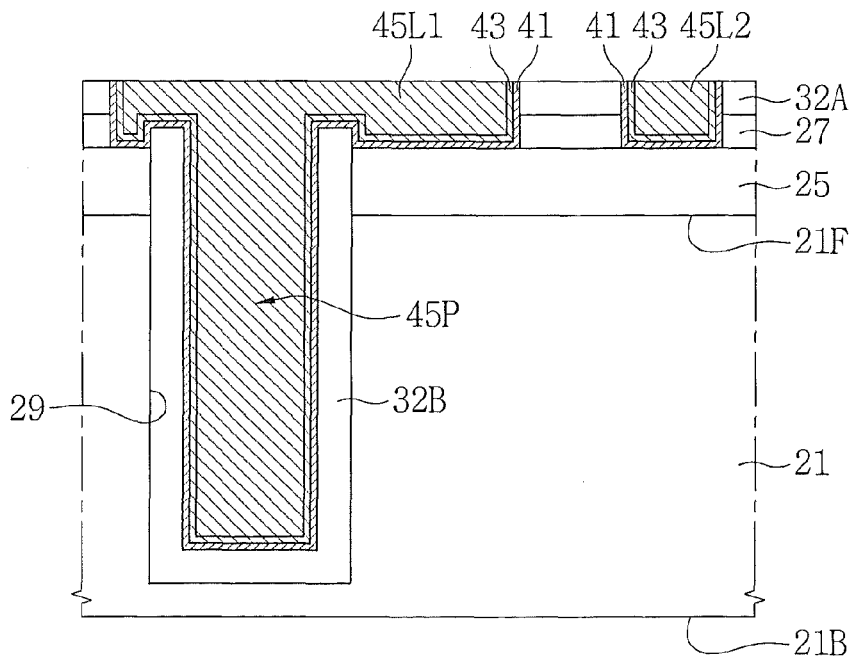

Referring to FIG. 43, when an upper surface of the spacer 32B protrudes to a level higher than that of the first insulating layer 25, the first barrier layer 41 may be in contact with an upper surface and sides of the spacer 32B.

Figure 44:
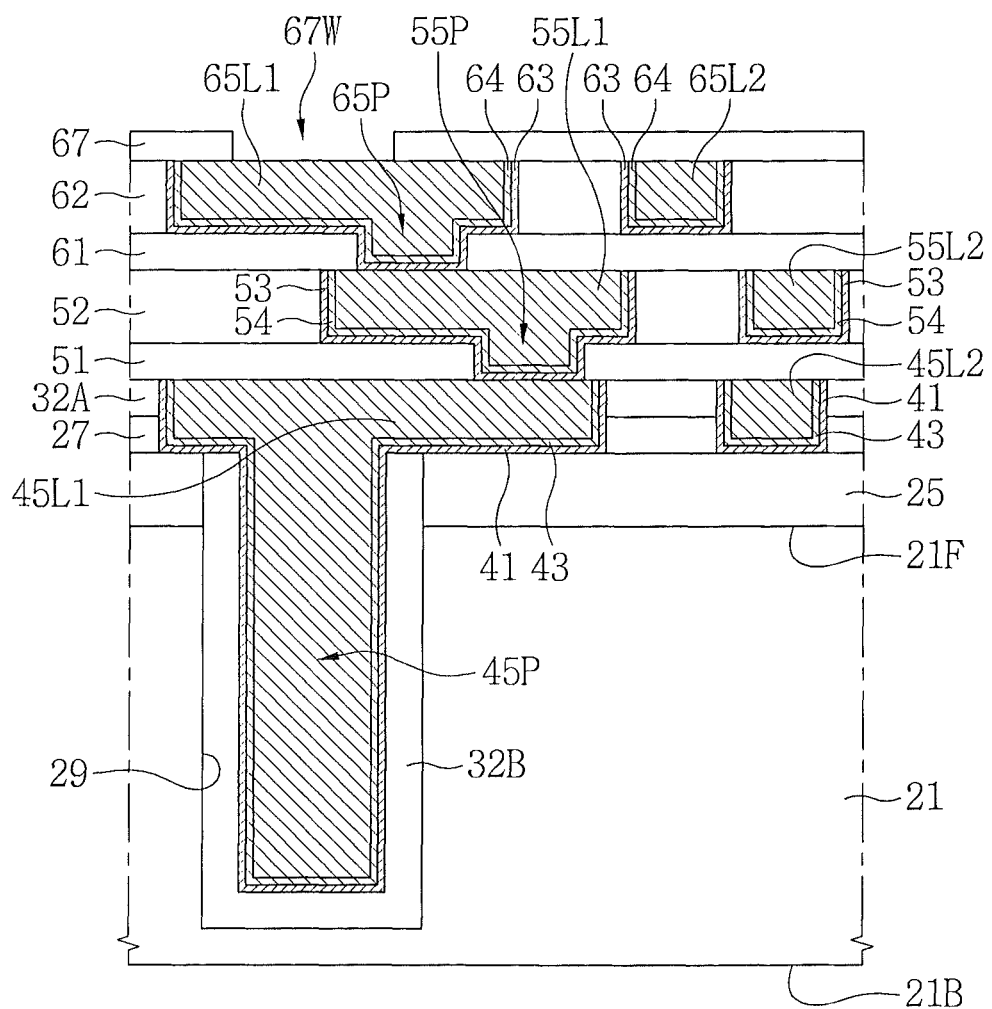

Referring to FIG. 44, a fourth insulating layer 51 may be formed on the first interconnection 45L1 and the second interconnection 45L2. A fifth insulating layer 52 may be formed on the fourth insulating layer 51. A sixth insulating layer 61 may be formed on the fifth insulating layer 52. A seventh insulating layer 62 may be formed on the sixth insulating layer 61. The fourth insulating layer 51 and the fifth insulating layer 52 may include different materials from each other. The sixth insulating layer 61 and the seventh insulating layer 62 may include different materials from each other. The fourth insulating layer 51, the fifth insulating layer 52, the sixth insulating layer 61, and the seventh insulating layer 62 may include silicon oxide, silicon nitride, silicon oxynitride, or a combination thereof.

A first plug 55P penetrating the fourth insulating layer 51, and connected to the first interconnection 45L1 may be formed. A third interconnection 55L1 and a fourth interconnection 55L2 may be formed on the fourth insulating layer 51. The first plug 55P may be in continuity with the third interconnection 55L1. The first plug 55P and the third interconnection 55L1 may have a continuous grain structure. The fourth interconnection 55L2 may be spaced from the third interconnection 55L1. A second barrier layer 53 and a second seed layer 54 sequentially stacked may be formed on sides and bottoms of the first plug 55P, the third interconnection 55L1, and the fourth interconnection 55L2. Upper surfaces of the fifth insulating layer 52, the third interconnection 55L1, and the fourth interconnection 55L2 may be formed substantially to the same level as each other. The second barrier layer 53 may include Ti, TiN, Ta, TaN, or a combination thereof. The second seed layer 54 may be a conductive layer, such as Cu or Ru. The first plug 55p, the third interconnection 55L1, and the fourth interconnection 55L2 may include a Cu layer using an electroplating method.

A second plug 65P penetrating the sixth insulating layer 61 and connected to the third interconnection 55L1 may be formed. A fifth interconnection 65L1 and a sixth interconnection 65L2 may be formed on the sixth insulating layer 61. The second plug 65P may be in continuity with the fifth interconnection 65L1. The second plug 65P and the fifth interconnection 65L1 may have a continuous grain structure. The sixth interconnection 65L2 may be spaced from the fifth interconnection 65L1. A third barrier layer 63 and a third seed layer 64 sequentially stacked may be formed on sides and bottoms of the second plug 65P, the fifth interconnection 65L1, and the sixth interconnection 65L2. Upper surfaces of the seventh insulating layer 62, the fifth interconnection 65L1, and the sixth interconnection 65L2 may be formed substantially to the same level as each other. The third barrier layer 63 may include Ti, TiN, Ta, TaN, or a combination thereof. The third seed layer may be a conductive layer, such as Cu or Ru. The second plug 65P, the fifth interconnection 65L1, and the sixth interconnection 65L2 may include a Cu layer using an electroplating method.

An eighth insulating layer 67 covering the fifth interconnection 65L1 and the sixth interconnection 65L2 may be formed on the seventh insulating layer 62. A connection window 67W penetrating the eighth insulating layer 67 and exposing a portion of the fifth interconnection 65L1 may be formed. The eighth insulating layer 67 may include silicon oxide, silicon nitride, silicon oxynitride, or a combination thereof. The eighth insulating layer 67 may be referred to as a passivation layer.

Figure 45:
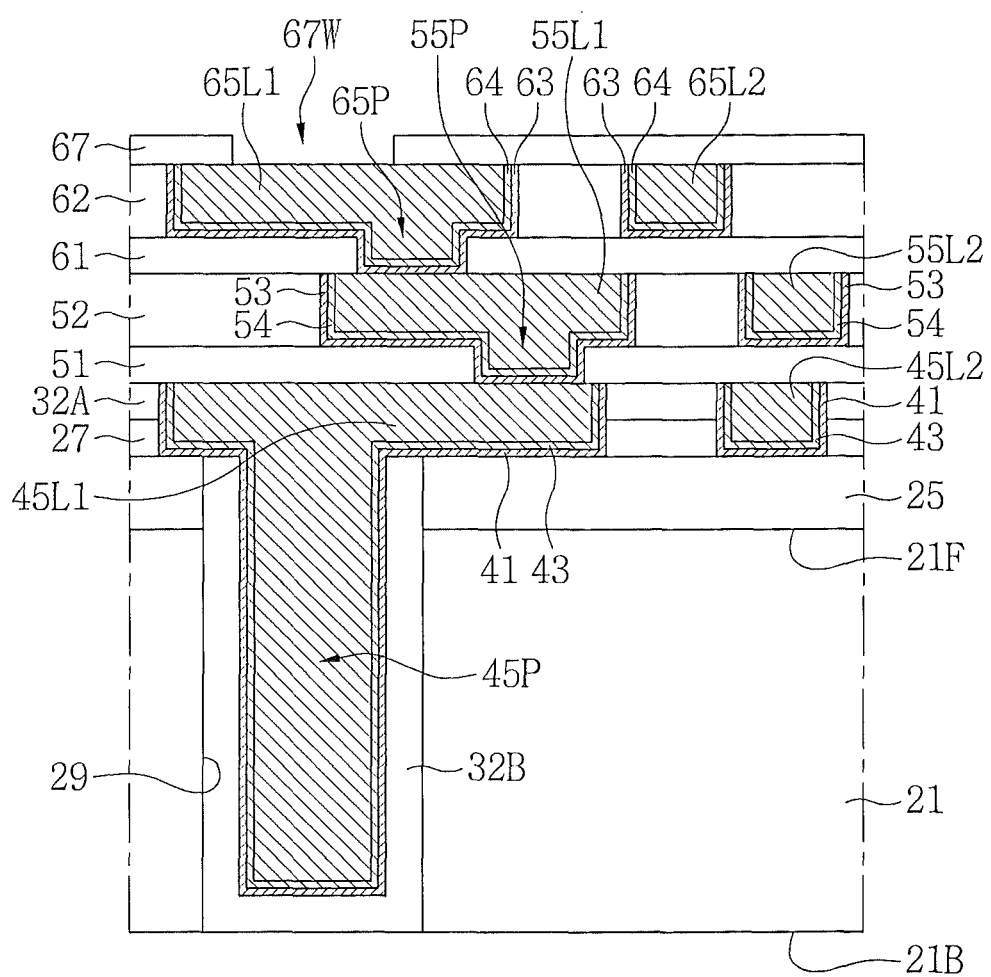

Referring to FIG. 45, the substrate 21 may be partially removed to expose the spacer 32B. A back grinding process may be applied to the partial removal of the substrate 21. A rear side 21B of the substrate 21 may be formed substantially to the same level as a bottom of the spacer 32B.

In some embodiments, the substrate 21 and the spacer 32B may be partially removed to expose the through electrode 45P without departing from the scope of the present inventive concept.

Figure 46:
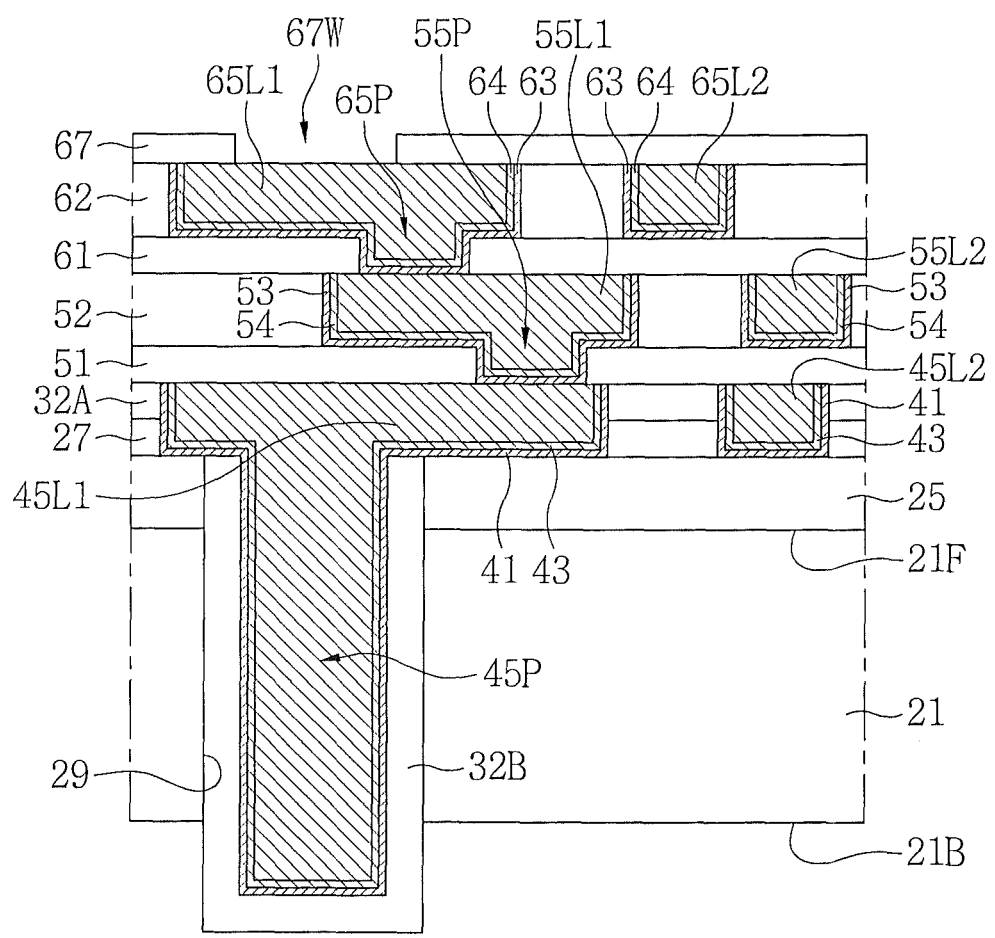

Referring to FIG. 46, the rear side 21B of the substrate 21 is etched back and the through electrode 45P and the spacer 32B may protrude.

Figure 47:
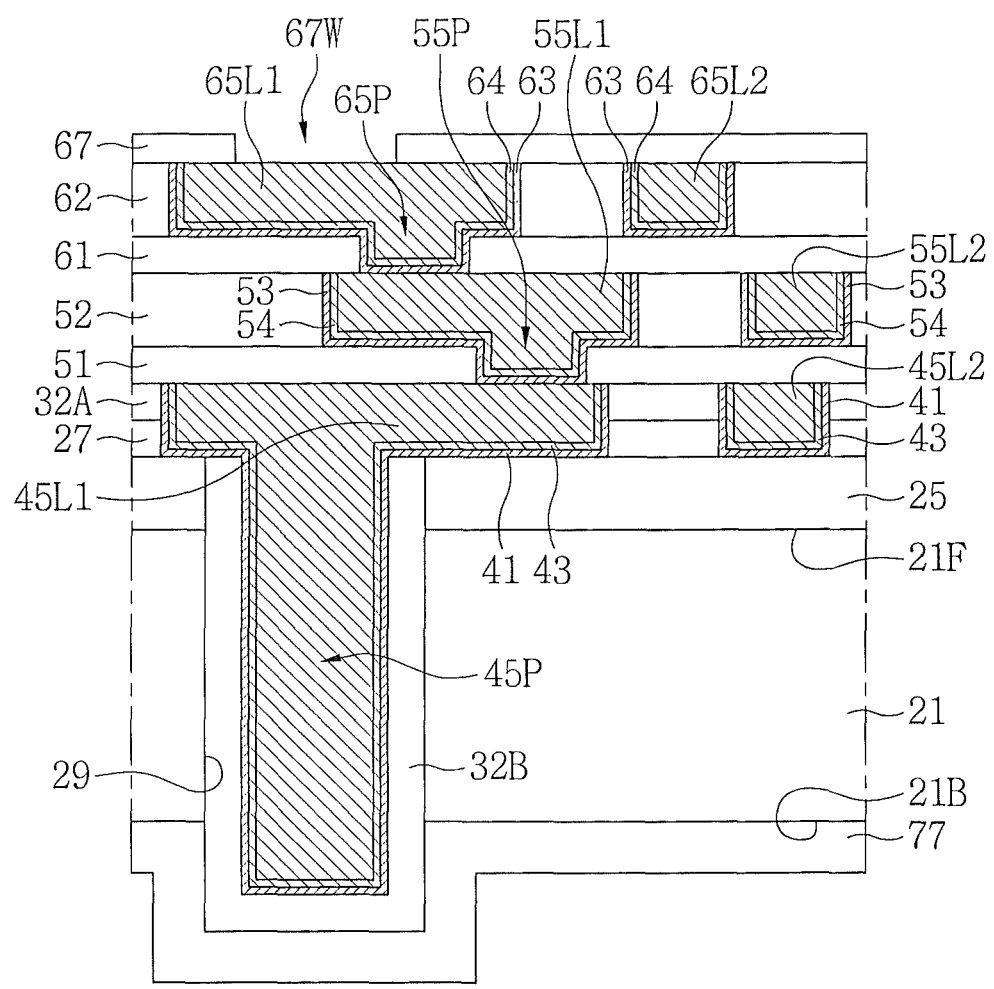

Referring to FIG. 47, a ninth insulating layer 77 covering the rear side 21B of the substrate 21 may be formed. The ninth insulating layer 77 may include silicon oxide, silicon nitride, silicon oxynitride, or a combination thereof. The ninth insulating layer 77 may cover the through electrode 45P and the spacer 32B. The ninth insulating layer 77 may be referred to as a rear side insulating layer.

Figure 48:
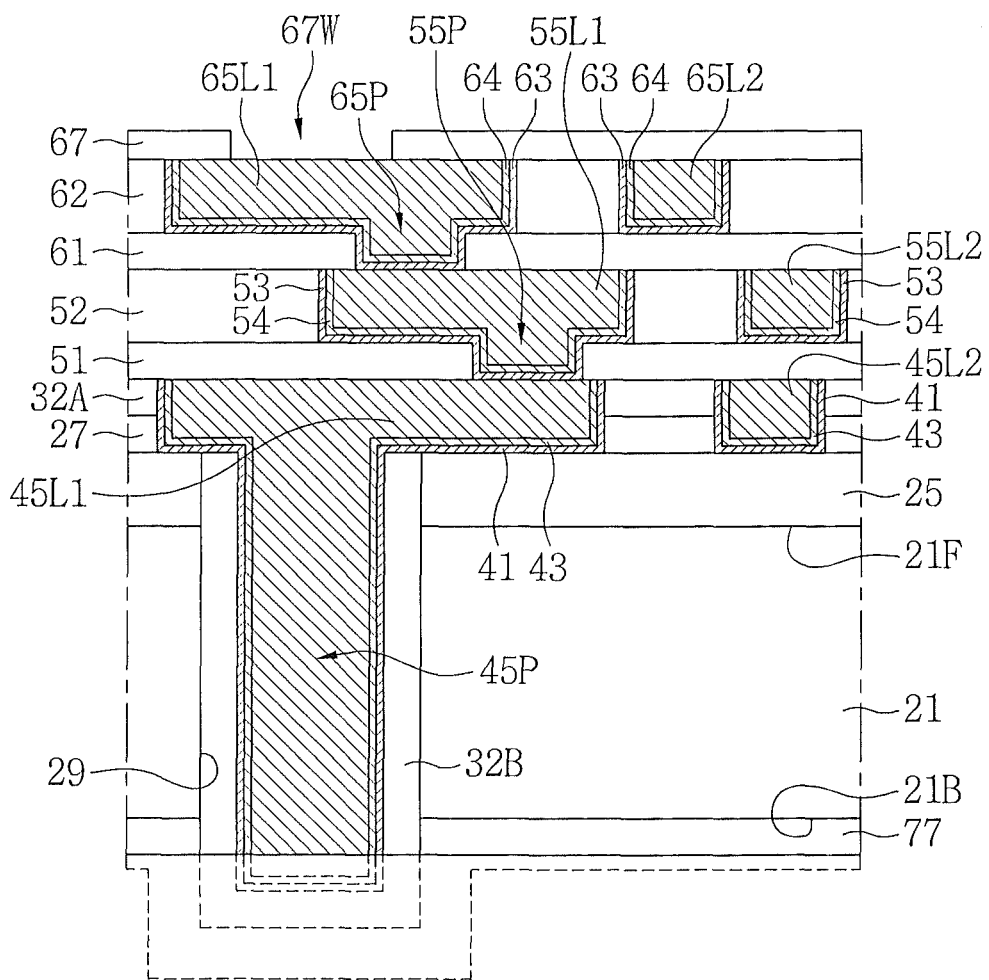

Referring to FIG. 48, the ninth insulating layer 77 may be planarized to expose the through electrode 45P. The spacer 32B may be retained between the ninth insulating layer 77 and the through electrode 45P.

Referring back to FIG. 20, a tenth insulating layer 81 may be formed on the ninth insulating layer 77. A fourth barrier layer 83, a fourth seed layer 84, and a seventh interconnection 85 penetrating the tenth insulating layer 81 may be sequentially formed. The fourth barrier layer 83, the fourth seed layer 84, and the seventh interconnection 85 may be in contact with a bottom of the through electrode 45P. The fourth seed layer 84 may cover a side and an upper surface of the seventh interconnection 85. The fourth barrier layer 83 may cover a side and an upper surface of the fourth seed layer 84. A first connection terminal 91 penetrating the eighth insulating layer 67 and connected to the fifth interconnection 65L1 may be formed. A second connection terminal 92 may be formed on the seventh interconnection 85.

The tenth insulating layer 81 may include silicon oxide, silicon nitride, silicon oxynitride, or a combination thereof. The seventh interconnection 85 may include a Cu layer using an electroplating method. The fourth barrier layer 83 may include Ti, TiN, Ta, TaN, or a combination thereof. The fourth seed layer 84 may be a conductive layer, such as Cu or Ru. The first connection terminal 91 may include a solder ball, a conductive bump, a conductive pin, a conductive paste, or a combination thereof. The second connection terminal 92 may include a solder ball, a conductive bump, a conductive pin, a conductive paste, or a combination thereof.

According to some embodiments of the inventive concept, a through electrode penetrating a substrate, an interconnection in continuity with the through electrode, and a barrier layer covering a side and a bottom of the interconnection and a side of the through electrode, may be provided. The through electrode and the interconnection may include the same material layer simultaneously formed. Remarkably better effects than in the related art in an aspect of improvement in electrical characteristics between the through electrode and the interconnection may be obtained. Good mass-production efficiency may be obtained in an aspect of simultaneous formation of the through electrode and the interconnection. Semiconductor devices with good electrical characteristics and increased mass-production efficiency as compared with the related art, may be implemented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device, comprising:
    a first insulating layer on a semiconductor substrate, the first insulating layer and the semiconductor substrate defining a through hole;
    a through electrode in the through hole;
    a spacer between the semiconductor substrate and the through electrode;
    an interconnection on the first insulating layer and in continuity with the through electrode;

a barrier layer covering a side and a bottom surface of the interconnection and a side of the through electrode, wherein the barrier layer is formed in one body a second insulating layer on the first insulating layer; and an interline insulating pattern on the second insulating layer, wherein the interline insulating pattern includes an insulating layer simultaneously formed with the spacer.

2. The semiconductor device of claim 1, wherein the through electrode and the interconnection comprise a same material layer.

3. The semiconductor device of claim 1, wherein the through electrode and the interconnection comprise a continuous grain structure.

4. The semiconductor device of claim 1, wherein no barrier layer is interposed between the through electrode and the interconnection.

5. The semiconductor device of claim 1, wherein an upper surface of the interconnection is formed at a same level as that of the interline insulating pattern.

6. The semiconductor device of claim 1:

wherein the second insulating layer and the interline insulating pattern cover the side of the interconnection; and wherein the barrier layer is positioned between the side of the interconnection and the interline insulating pattern and between the side of the interconnection and the second insulating layer.

7. The semiconductor device of claim 1, further comprising a seed layer between the interconnection and the barrier layer and between the through electrode and the barrier layer.

8. The semiconductor device of claim 7, wherein no seed layer is provided between the through electrode and the interconnection.

9. A semiconductor device, comprising:

a semiconductor substrate having a first side and a second side;

a first insulating layer configured to cover the first side of the semiconductor substrate, the semiconductor substrate and the first insulating layer defining a through hole;

a through electrode in the through hole;

a spacer between the semiconductor substrate and the through electrode;

a first interconnection in continuity with the through electrode and on the first insulating layer;

a second interconnection spaced apart from the first interconnection and on the first insulating layer;

a first barrier layer covering sides and bottoms of the first and second interconnections, and a side of the through electrode;

a third interconnection connected to the through electrode and on the second side of the semiconductor substrate; and a second barrier layer covering a side and an upper surface of the third interconnection, wherein no barrier layer is provided between the through electrode and the first interconnection; and the second barrier layer is between the through electrode and the third interconnection.

10. The semiconductor device of claim 9, wherein the through electrode, the first interconnection, and the second interconnection comprise a same material layer simultaneously formed.

11. The semiconductor device of claim 9, comprising:

a second insulating layer on the first insulating layer; and an interline insulating pattern on the second insulating layer, wherein the second insulating layer and the interline insulating pattern are provided between the first interconnection and the second interconnection, and the interline insulating pattern includes a same insulating layer simultaneously formed with the spacer.

12. The semiconductor device of claim 9, further comprising:

a first seed layer between the first interconnection and the first barrier layer, between the second interconnection and the first barrier layer, and between the through electrode and the first barrier layer; and a second seed layer between the third interconnection and the second barrier layer, wherein no seed layer is provided between the through electrode and the first interconnection; and the second seed layer is between the through electrode and the third interconnection.

13. The semiconductor device of claim 9:

wherein an upper surface of the spacer protrudes to a level higher than the first insulating layer; and a first barrier layer is in contact with an upper surface and sides of the spacer.

14. A semiconductor device, comprising:

a semiconductor substrate defining a through hole therethrough;

a through electrode in the through hole;

a spacer between the semiconductor substrate and the through electrode;

an interconnection in continuity with the through electrode;

a barrier layer covering a side and a bottom surface of the interconnection and a side of the through electrode;

an insulating layer on the semiconductor substrate; and an interline insulating pattern on the insulating layer, wherein the interline insulating pattern includes an insulating layer simultaneously formed with the spacer.

15. The semiconductor device of claim 14, wherein the insulating layer is a second insulating layer, the semiconductor device further comprising:

a first insulating layer on the semiconductor substrate between the substrate and the second insulating layer, wherein the first insulating layer and the semiconductor substrate define the through hole.

16. The semiconductor device of claim 15, wherein the through electrode and the interconnection comprise a same material layer and are formed simultaneously.

17. The semiconductor device of claim 15, wherein the through electrode and the interconnection comprise a continuous grain structure.

18. The semiconductor device of claim 15, wherein no barrier layer is interposed between the through electrode and the interconnection.

* * * * *